United States Patent
Hu et al.

(10) Patent No.: US 11,984,915 B2
(45) Date of Patent: May 14, 2024

(54) TEMPERATURE COMPENSATION CIRCUIT AND PHASED ARRAY APPARATUS

(71) Applicant: HUAWEI TECHNOLOGIES CO., LTD., Guangdong (CN)

(72) Inventors: Junwei Hu, Shanghai (CN); Rong Peng, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 486 days.

(21) Appl. No.: 17/242,525

(22) Filed: Apr. 28, 2021

(65) Prior Publication Data

US 2021/0249790 A1    Aug. 12, 2021

Related U.S. Application Data

(63) Continuation of application No. PCT/CN2018/113097, filed on Oct. 31, 2018.

(51) Int. Cl.
    *H01Q 23/00*    (2006.01)
    *H01Q 21/06*    (2006.01)
    *H04B 1/036*    (2006.01)

(52) U.S. Cl.
    CPC .................... *H04B 1/036* (2013.01)

(58) Field of Classification Search
    CPC ............... H03F 1/30; H03F 2200/294; H03F 2200/447; H03F 2200/451; H03F 3/19; H04B 1/036; H04B 7/04

(Continued)

(56) References Cited

U.S. PATENT DOCUMENTS 4,882,767 A    11/1989  Machida et al.
11,329,378 B2 *  5/2022  Sharvit ................... H01Q 3/36

(Continued)

FOREIGN PATENT DOCUMENTS

CN      1391419 A    1/2003
CN    202076989 U   12/2011

(Continued)

OTHER PUBLICATIONS

EPO Partial Supplementary European Search Report issued in European Application No. 18938400.1 dated Sep. 14, 2021, 13 pages.

(Continued)

*Primary Examiner* — Tan H Trinh
(74) *Attorney, Agent, or Firm* — HUAWEI TECHNOLOGIES CO., LTD.

(57) ABSTRACT

Example temperature compensation circuits and a phased array apparatus are described. One example temperature compensation circuit is applied to a signal processing path. The example temperature compensation circuit includes a temperature detection circuit, a temperature conversion circuit, and a passive variable attenuator. The passive variable attenuator is configured to be connected in series in the signal processing path. The temperature detection circuit is configured to generate a temperature signal and a reference signal, and output the temperature signal and the reference signal to the temperature conversion circuit. The temperature signal monotonically changes with a temperature of the signal processing path. The temperature conversion circuit is configured to generate a control signal based on the temperature signal and the reference signal. The passive variable attenuator is configured to adjust, under control of the control signal, an attenuation value of a signal processed by the signal processing path.

19 Claims, 19 Drawing Sheets

(58) Field of Classification Search
USPC .................................................. 455/561, 283
See application file for complete search history.

(56) References Cited

U.S. PATENT DOCUMENTS

| | | | |
|---|---|---|---|
| 2001/0054927 A1 | 12/2001 | Zhou et al. | |
| 2007/0142015 A1* | 6/2007 | Brandley | H03F 3/45475 |
| | | | 455/283 |
| 2007/0161359 A1 | 7/2007 | Mccarthy et al. | |
| 2007/0287383 A1* | 12/2007 | Fan | H04B 1/036 |
| | | | 455/73 |
| 2008/0048751 A1* | 2/2008 | Koen | H03G 1/007 |
| | | | 327/308 |
| 2011/0148502 A1* | 6/2011 | Granger-Jones | H03L 5/00 |
| | | | 327/308 |
| 2011/0148503 A1* | 6/2011 | Granger-Jones | H03L 5/00 |
| | | | 327/308 |
| 2012/0280738 A1* | 11/2012 | Granger-Jones | H03L 5/00 |
| | | | 438/109 |
| 2013/0127513 A1* | 5/2013 | Granger-Jones | H03H 11/245 |
| | | | 327/308 |
| 2016/0344393 A1 | 11/2016 | Kawano | |
| 2016/0373071 A1* | 12/2016 | Retz | H03G 3/3042 |
| 2017/0070247 A1* | 3/2017 | Hageman | H04W 72/20 |
| 2018/0115287 A1* | 4/2018 | Rabjohn | H03F 1/02 |
| 2018/0159482 A1* | 6/2018 | Yoshizaki | H03F 3/245 |
| 2022/0285838 A1* | 9/2022 | Sharvit | H03H 11/20 |

FOREIGN PATENT DOCUMENTS

| | | |
|---|---|---|
| CN | 202268852 U | 6/2012 |
| CN | 104734656 A | 6/2015 |
| CN | 106532276 A | 3/2017 |
| CN | 107238819 A | 10/2017 |
| WO | 2012144104 A1 | 10/2012 |

OTHER PUBLICATIONS

Office Action issued in Chinese Application No. 201880098673.1 dated Dec. 27, 2021, 14 pages (with English translation).
PCT International Search Report and Written Opinion in International Application No. PCT/CN2018/113097, dated Jul. 29, 2019, 17 pages.

* cited by examiner

TEMPERATURE COMPENSATION CIRCUIT AND PHASED ARRAY APPARATUS

CROSS-REFERENCE TO RELATED APPLICATIONS

This application is a continuation of International Application No. PCT/CN2018/113097, filed on Oct. 31, 2018, which is hereby incorporated by reference in its entirety.

TECHNICAL FIELD

This application relates to the field of communications technologies, and in particular, to a temperature compensation circuit and a phased array apparatus.

BACKGROUND

Performance of a component in a signal processing path generally deteriorates with an increasing temperature. For example, a gain of an amplifier constructed by using a metal-oxide-semiconductor field-effect transistor (MOSFET) or a bipolar junction transistor (BJT) gradually decreases with the increasing temperature. When the signal processing path works in a high frequency band, the increasing temperature causes a more significant gain loss of the amplifier. In addition, a high frequency effect such as a skin effect causes a metal loss in the signal processing path to increase with an increasing frequency. Due to impact of fluctuations of an ambient temperature and changes in operating power consumption, a temperature fluctuation range of the signal processing path in a working process is usually relatively large. As a result, a gain in the signal processing path has a relatively large fluctuation, and stability of the signal processing path is affected.

To reduce impact of a temperature change on the gain in the signal processing path, temperature compensation needs to be performed for the signal processing path. In the prior art, a module-level temperature compensation solution is usually used. For example, a bias of a type being in a positive correlation with the temperature is used or a load of a type being in a positive correlation with the temperature is used to compensate for a gain change of the signal processing path caused by the temperature.

However, temperature compensation capabilities of the foregoing two module-level compensation solutions are limited. Especially when the signal processing path works in a microwave frequency band, a temperature change significantly affects the gain. Even if both of the two compensation solutions are used, the temperature change still has large impact on the gain in the signal processing path.

SUMMARY

Embodiments of this application provide a temperature compensation circuit and a phased array apparatus, to reduce impact of a temperature change on a gain in a signal processing path.

According to a first aspect, this application provides a temperature compensation circuit, applied to a signal processing path. The temperature compensation circuit includes a temperature detection circuit, a temperature conversion circuit, and a passive variable attenuator. The passive variable attenuator is configured to be connected in series in the signal processing path. The temperature detection circuit is configured to generate a temperature signal and a reference signal, and output the temperature signal and the reference signal to the temperature conversion circuit. The temperature signal monotonically changes with a temperature of the signal processing path. The temperature conversion circuit is configured to generate a control signal based on the temperature signal and the reference signal. The passive variable attenuator is configured to adjust, under control of the control signal, an attenuation value of a signal processed by the signal processing path. This helps reduce impact of a temperature change on a gain in the signal processing path. The temperature compensation circuit is a passive circuit, which hardly increases power consumption of the signal processing path. Different from unidirectionality of an active component, one end of the passive variable attenuator may be used as an input end and an output end, making it especially suitable for application in a time division duplex mobile communications system, so that a signal transmitting path and a signal receiving path in the time division duplex mobile communications system can share a temperature compensation circuit, thereby helping reduce costs and reduce a chip area.

Optionally, with reference to the first aspect, in a first possible implementation of the first aspect of this application, the passive variable attenuator is a distributed attenuation structure, and the passive variable attenuator includes a parallel branch and a series branch. The temperature conversion circuit is configured to output the control signal to a control end of a variable resistor circuit of the parallel branch of the passive variable attenuator.

Optionally, with reference to the first aspect or the first possible implementation of the first aspect, in a second possible implementation of the first aspect of this application, the control signal is in a linear correlation with the temperature signal.

Optionally, with reference to the second possible implementation of the first aspect, in a third possible implementation of the first aspect of this application, the temperature conversion circuit includes a voltage follower, an operational amplifier, a first resistor, and a second resistor. One end of the first resistor is connected to an output end of the voltage follower, the other end of the first resistor is connected to an out-phase input end of the operational amplifier, and two ends of the second resistor are respectively connected to the out-phase input end of the operational amplifier and an output end of the operational amplifier. An input end of the voltage follower is configured to receive the temperature signal, an in-phase input end of the operational amplifier is configured to receive the reference signal, and the output end of the operational amplifier is configured to output the control signal.

Optionally, with reference to the first aspect, in a fourth possible implementation of the first aspect of this application, the passive variable attenuator is an embedded switch-mode attenuator structure, and the passive variable attenuator includes a series branch and a parallel branch. The control signal includes a first control signal and a second control signal, and a trend of changing with the temperature by the second control signal is opposite to a trend of changing with the temperature by the first control signal. The temperature conversion circuit is configured to output the first control signal to a control end of a variable resistor circuit of the parallel branch of the passive variable attenuator, and output the second control signal to a control end of a variable resistor circuit of the series branch of the passive variable attenuator.

Optionally, with reference to the fourth possible implementation of the first aspect, in a fifth possible implementation of the first aspect of this application, the series branch of the passive variable attenuator includes a phase compensation inductor, and the phase compensation inductor is configured to maintain a constant phase of the passive variable attenuator in cases of different attenuation values.

Optionally, with reference to the fifth possible implementation of the first aspect, in a sixth possible implementation of the first aspect of this application, the temperature conversion circuit includes a first temperature conversion circuit and a second temperature conversion circuit. The first temperature conversion circuit is configured to generate the first control signal based on the temperature signal and the reference signal. The first control signal is in a linear correlation with the temperature signal. The second temperature conversion circuit is configured to generate the second control signal based on the temperature signal and the reference signal. The second control signal is in a linear correlation with the temperature signal.

Optionally, with reference to the sixth possible implementation of the first aspect, in a seventh possible implementation of the first aspect of this application, the first temperature conversion circuit includes a first voltage follower, a first operational amplifier, a first resistor, and a second resistor. One end of the first resistor is connected to an output end of the first voltage follower, the other end of the first resistor is connected to an out-phase input end of the first operational amplifier, and two ends of the second resistor are respectively connected to the out-phase input end and an output end of the first operational amplifier. An input end of the first voltage follower is configured to receive the temperature signal, an in-phase input end of the first operational amplifier is configured to receive the reference signal, and the output end of the first operational amplifier is configured to output the first control signal. The second temperature conversion circuit includes a second voltage follower, a second operational amplifier, a third resistor, and a fourth resistor. One end of the third resistor is connected to an output end of the second voltage follower, the other end of the third resistor is connected to an out-phase input end of the second operational amplifier, and two ends of the fourth resistor are respectively connected to an out-phase input end and an output end of the second operational amplifier. An input end of the second voltage follower is configured to receive the reference signal, an in-phase input end of the second operational amplifier is configured to receive the temperature signal, and the output end of the second operational amplifier is configured to output the second control signal.

Optionally, with reference to any one of the first possible implementation of the first aspect to the seventh possible implementation of the first aspect, in an eighth possible implementation of the first aspect of this application, the variable resistor circuit includes at least two variable resistors connected in parallel, a control end of the variable resistor is controlled by a multiplexer, and through control of the multiplexer, the control signal is input to the control end of the variable resistor, or a fixed level is input to the control end of the variable resistor. A process of adjusting a temperature compensation curve of the temperature compensation circuit can be simplified by adjusting an attenuation capability of the passive variable attenuator by using the multiplexer.

Optionally, with reference to any one of the first aspect to the eighth possible implementation of the first aspect, in a ninth possible implementation of the first aspect of this application, the temperature detection circuit includes a bandgap reference circuit, and the bandgap reference circuit is configured to generate the temperature signal and the reference signal.

Optionally, with reference to any one of the first aspect to the eighth possible implementation of the first aspect, in the ninth possible implementation of the first aspect of this application, the temperature detection circuit includes a bandgap reference circuit and a temperature sensor circuit, the bandgap reference circuit is configured to generate the reference signal, and the temperature sensor circuit is configured to generate the temperature signal.

According to a second aspect, this application provides a phased array apparatus, including: a plurality of antenna array units, a first temperature compensation circuit, and a common path. Each antenna array unit has one end connected to an antenna, and the other end connected to a first end of the common path, and signals flowing through any antenna array unit are all input to the common path, or output by the common path. The first temperature compensation circuit is connected in series in the common path, and is configured to perform temperature compensation for the phased array apparatus based on a temperature of the antenna array unit and/or a temperature of the common path. Temperature compensation can be performed for the common path and the antenna array units by using only the first temperature compensation circuit connected in series in the common path, thereby helping reduce hardware overheads and reduce a size of the phased array apparatus.

Optionally, with reference to the second aspect, in a first possible implementation of the second aspect, the phased array apparatus further includes a plurality of second temperature compensation circuits, each of the second temperature compensation circuit is connected in series in the antenna array unit, the second temperature compensation circuit is disposed in a one-to-one correspondence with the antenna array unit, and each of the second temperature compensation circuit is configured to perform, based on a temperature of the antenna array unit corresponding to the second temperature compensation circuit, temperature compensation for the antenna array unit corresponding to the second temperature compensation circuit. The temperature compensation circuits are respectively placed in the antenna array units and the common path of the antenna array units, so that the temperature compensation circuits are disposed in the phased array apparatus in a distributed manner, thereby helping minimize impact of the temperature compensation circuits on linearity and noise of the phased array apparatus.

Optionally, with reference to the second aspect or the first possible implementation of the second aspect, in a second possible implementation of the second aspect, inter-stage amplifiers in the antenna array units all use a bias in direct proportion to an absolute temperature.

Optionally, with reference to the first possible implementation of the second aspect or the second possible implementation of the second aspect, in a third possible implementation of the second aspect, the second temperature compensation circuit includes a temperature detection circuit, a temperature conversion circuit, and a passive variable attenuator. The passive variable attenuator in the second temperature compensation circuit is configured to be connected in series in the corresponding antenna array unit. The temperature detection circuit in the second temperature compensation circuit is configured to generate a temperature signal and a reference signal, and output the generated temperature signal and reference signal to the temperature conversion circuit in the second temperature compensation circuit. The temperature signal generated by the temperature detection circuit in the second temperature compensation circuit monotonically changes with a temperature of the corresponding antenna array unit. The temperature conversion circuit in the second temperature compensation circuit is configured to generate a control signal based on the temperature signal and the reference signal that are generated by the temperature detection circuit in the second temperature compensation circuit. The passive variable attenuator in the second temperature compensation circuit is configured to adjust, under control of the control signal generated by the temperature conversion circuit in the second temperature compensation circuit, an attenuation value of a signal processed by the antenna array unit corresponding to the second temperature compensation circuit.

Optionally, with reference to the third possible implementation of the second aspect, in a fourth possible implementation of the second aspect, the passive variable attenuator in the second temperature compensation circuit is a distributed attenuation structure, and the passive variable attenuator in the second temperature compensation circuit includes a parallel branch and a series branch. The temperature conversion circuit in the second temperature compensation circuit is configured to output the control signal generated by the temperature conversion circuit in the second temperature compensation circuit to a control end of a variable resistor circuit of the parallel branch of the passive variable attenuator in the second temperature compensation circuit.

Optionally, with reference to the third possible implementation or the fourth possible implementation of the second aspect, in a fifth possible implementation of the second aspect, the control signal generated by the temperature conversion circuit in the second temperature compensation circuit is in a linear correlation with the temperature signal.

Optionally, with reference to the fifth possible implementation of the second aspect, in a sixth possible implementation of the second aspect, the temperature conversion circuit in the second temperature compensation circuit includes a voltage follower, an operational amplifier, a first resistor, and a second resistor. One end of the first resistor in the second temperature compensation circuit is connected to an output end of the voltage follower in the second temperature compensation circuit, the other end of the first resistor in the second temperature compensation circuit is connected to an out-phase input end of the operational amplifier in the second temperature compensation circuit, and two ends of the second resistor in the second temperature compensation circuit are respectively connected to the out-phase input end of the operational amplifier in the second temperature compensation circuit and an output end of the operational amplifier in the second temperature compensation circuit. An input end of the voltage follower in the second temperature compensation circuit is configured to receive the temperature signal generated by the temperature detection circuit in the second temperature compensation circuit, an in-phase input end of the operational amplifier in the second temperature compensation circuit is configured to receive the reference signal generated by the temperature detection circuit in the second temperature compensation circuit, and the output end of the operational amplifier in the second temperature compensation circuit is configured to output the control signal generated by the temperature conversion circuit in the second temperature compensation circuit.

Optionally, with reference to the third possible implementation of the second aspect, in a seventh possible implementation of the second aspect of this application, the passive variable attenuator in the second temperature compensation circuit is an embedded switch-mode attenuator structure, and the passive variable attenuator in the second temperature compensation circuit includes a series branch and a parallel branch. The control signal generated by the temperature conversion circuit in the second temperature compensation circuit includes a first control signal and a second control signal, and a trend of changing with the temperature by the second control signal in the second temperature compensation circuit is opposite to a trend of changing with the temperature by the first control signal in the second temperature compensation circuit. The temperature conversion circuit in the second temperature compensation circuit is configured to output the first control signal to a control end of a variable resistor circuit of the parallel branch of the passive variable attenuator in the second temperature compensation circuit, and output the second control signal to a control end of a variable resistor circuit of the series branch of the passive variable attenuator in the second temperature compensation circuit.

Optionally, with reference to the seventh possible implementation of the second aspect, in an eighth possible implementation of the second aspect of this application, the series branch of the passive variable attenuator in the second temperature compensation circuit includes a phase compensation inductor, and the phase compensation inductor of the passive variable attenuator in the second temperature compensation circuit is configured to maintain a constant phase of the passive variable attenuator in the second temperature compensation circuit in cases of different attenuation values.

Optionally, with reference to the eighth possible implementation of the second aspect, in a ninth possible implementation of the second aspect of this application, the temperature conversion circuit in the second temperature compensation circuit includes a first temperature conversion circuit and a second temperature conversion circuit. The first temperature conversion circuit in the second temperature compensation circuit is configured to generate the first control signal based on the temperature signal and the reference signal that are generated by the temperature detection circuit in the second temperature compensation circuit. The first control signal in the second temperature compensation circuit is in a linear correlation with the temperature signal generated by the temperature detection circuit in the second temperature compensation circuit. The second temperature conversion circuit in the second temperature compensation circuit is configured to generate the second control signal based on the temperature signal and the reference signal that are generated by the temperature detection circuit in the second temperature compensation circuit. The second control signal in the second temperature compensation circuit is in a linear correlation with the temperature signal generated by the temperature detection circuit in the second temperature compensation circuit.

Optionally, with reference to the ninth possible implementation of the second aspect, in a tenth possible implementation of the second aspect, the first temperature conversion circuit in the second temperature compensation circuit includes a first voltage follower, a first operational amplifier, a first resistor, and a second resistor. One end of the first resistor in the second temperature compensation circuit is connected to an output end of the first voltage follower in the second temperature compensation circuit, the other end of the first resistor in the second temperature compensation circuit is connected to an out-phase input end of the first operational amplifier in the second temperature compensation circuit, and two ends of the second resistor in the second temperature compensation circuit are respectively connected to the out-phase input end and an output end of the first operational amplifier in the second temperature compensation circuit. An input end of the first voltage follower in the second temperature compensation circuit is configured to receive the temperature signal generated by the temperature detection circuit in the second temperature compensation circuit, an in-phase input end of the first operational amplifier in the second temperature compensation circuit is configured to receive the reference signal generated by the temperature detection circuit in the second temperature compensation circuit, and the output end of the first operational amplifier in the second temperature compensation circuit is configured to output the first control signal. The second temperature conversion circuit in the second temperature compensation circuit includes a second voltage follower, a second operational amplifier, a third resistor, and a fourth resistor. One end of the third resistor in the second temperature compensation circuit is connected to an output end of the second voltage follower in the second temperature compensation circuit, the other end of the third resistor in the second temperature compensation circuit is connected to an out-phase input end of the second operational amplifier in the second temperature compensation circuit, and two ends of the fourth resistor in the second temperature compensation circuit are respectively connected to the out-phase input end and an output end of the second operational amplifier in the second temperature compensation circuit. An input end of the second voltage follower in the second temperature compensation circuit is configured to receive the reference signal generated by the temperature detection circuit in the second temperature compensation circuit, an in-phase input end of the second operational amplifier in the second temperature compensation circuit is configured to receive the temperature signal generated by the temperature detection circuit in the second temperature compensation circuit, and the output end of the second operational amplifier in the second temperature compensation circuit is configured to output the second control signal in the second temperature compensation circuit.

Optionally, with reference to any one of the fourth possible implementation to the tenth possible implementation of the second aspect, in an eleventh possible implementation of the second aspect, the variable resistor circuit in the second temperature compensation circuit includes at least two variable resistors connected in parallel, a control end of the variable resistor in the second temperature compensation circuit is controlled by a multiplexer, and through control of the multiplexer in the second temperature compensation circuit, the control signal generated by the temperature conversion circuit in the second temperature compensation circuit is input to the control end of the variable resistor in the second temperature compensation circuit, or a fixed level is input to the control end of the variable resistor in the second temperature compensation circuit.

Optionally, with reference to any one of the second aspect to the eleventh possible implementations of the second aspect of this application, in a twelfth possible implementation of the second aspect of this application, the first temperature compensation circuit includes a temperature detection circuit, a temperature conversion circuit, and a passive variable attenuator. The passive variable attenuator in the first temperature compensation circuit is configured to be connected in series in the common path. The temperature detection circuit in the first temperature compensation circuit is configured to generate a temperature signal and a reference signal, and output the generated temperature signal and reference signal to the temperature conversion circuit in the first temperature compensation circuit. The temperature signal generated by the temperature detection circuit in the first temperature compensation circuit monotonically changes with a temperature of the antenna array unit and/or a temperature of the common path. The temperature conversion circuit in the first temperature compensation circuit is configured to generate a control signal based on the temperature signal and the reference signal that are generated by the temperature detection circuit in the first temperature compensation circuit. The passive variable attenuator in the first temperature compensation circuit is configured to adjust, under control of the control signal generated by the temperature conversion circuit in the first temperature compensation circuit, an attenuation value of a signal processed by the phased array apparatus.

Optionally, with reference to the twelfth possible implementation of the second aspect, in a thirteenth possible implementation of the second aspect, the passive variable attenuator in the first temperature compensation circuit is a distributed attenuation structure, and the passive variable attenuator in the first temperature compensation circuit includes a parallel branch and a series branch. The temperature conversion circuit in the first temperature compensation circuit is configured to output the control signal generated by the temperature conversion circuit in the first temperature compensation circuit to a control end of a variable resistor circuit of the parallel branch of the passive variable attenuator in the first temperature compensation circuit.

Optionally, with reference to the twelfth possible implementation or the thirteenth possible implementation of the second aspect, in a fourteenth possible implementation of the second aspect of this application, the control signal generated by the temperature conversion circuit in the first temperature compensation circuit is in a linear correlation with the temperature signal.

Optionally, with reference to the fourteenth possible implementation of the second aspect, in a fifteenth possible implementation of the second aspect, the temperature conversion circuit in the first temperature compensation circuit includes a voltage follower, an operational amplifier, a first resistor, and a second resistor. One end of the first resistor in the first temperature compensation circuit is connected to an output end of the voltage follower in the first temperature compensation circuit, the other end of the first resistor in the first temperature compensation circuit is connected to an out-phase input end of the operational amplifier in the first temperature compensation circuit, and two ends of the second resistor in the first temperature compensation circuit are respectively connected to the out-phase input end of the operational amplifier in the first temperature compensation circuit and an output end of the operational amplifier in the first temperature compensation circuit. An input end of the voltage follower in the first temperature compensation circuit is configured to receive the temperature signal generated by the temperature detection circuit in the first temperature compensation circuit, an in-phase input end of the operational amplifier in the first temperature compensation circuit is configured to receive the reference signal generated by the temperature detection circuit in the first temperature compensation circuit, and the output end of the operational amplifier in the first temperature compensation circuit is configured to output the control signal generated by the temperature conversion circuit in the first temperature compensation circuit.

Optionally, with reference to the twelfth possible implementation of the second aspect, in a sixteenth possible implementation of the second aspect, the passive variable attenuator in the first temperature compensation circuit is an embedded switch-mode attenuator structure, and the passive variable attenuator in the first temperature compensation circuit includes a series branch and a parallel branch. The control signal generated by the temperature conversion circuit in the first temperature compensation circuit includes a first control signal and a second control signal, and a trend of changing with the temperature by the second control signal in the first temperature compensation circuit is opposite to a trend of changing with the temperature by the first control signal in the first temperature compensation circuit. The temperature conversion circuit in the first temperature compensation circuit is configured to output the first control signal to a control end of a variable resistor circuit of the parallel branch of the passive variable attenuator in the first temperature compensation circuit, and output the second control signal to a control end of a variable resistor circuit of the series branch of the passive variable attenuator in the first temperature compensation circuit.

Optionally, with reference to the sixteenth possible implementation of the second aspect, in a seventeenth possible implementation of the second aspect of this application, the series branch of the passive variable attenuator in the first temperature compensation circuit includes a phase compensation inductor, and the phase compensation inductor of the passive variable attenuator in the first temperature compensation circuit is configured to maintain a constant phase of the passive variable attenuator in the first temperature compensation circuit in cases of different attenuation values.

Optionally, with reference to the seventeenth possible implementation of the second aspect, in an eighteenth possible implementation of the second aspect, the temperature conversion circuit in the first temperature compensation circuit includes a first temperature conversion circuit and a second temperature conversion circuit. The first temperature conversion circuit in the first temperature compensation circuit is configured to generate the first control signal based on the temperature signal and the reference signal that are generated by the temperature detection circuit in the first temperature compensation circuit. The first control signal in the first temperature compensation circuit is in a linear correlation with the temperature signal generated by the temperature detection circuit in the first temperature compensation circuit. The second temperature conversion circuit in the first temperature compensation circuit is configured to generate the second control signal based on the temperature signal and the reference signal that are generated by the temperature detection circuit in the first temperature compensation circuit. The second control signal in the first temperature compensation circuit is in a linear correlation with the temperature signal generated by the temperature detection circuit in the first temperature compensation circuit.

Optionally, with reference to the eighteenth possible implementation of the second aspect, in a nineteenth possible implementation of the second aspect, the first temperature conversion circuit in the first temperature compensation circuit includes a first voltage follower, a first operational amplifier, a first resistor, and a second resistor. One end of the first resistor in the first temperature compensation circuit is connected to an output end of the first voltage follower in the first temperature compensation circuit, the other end of the first resistor in the first temperature compensation circuit is connected to an out-phase input end of the first operational amplifier in the first temperature compensation circuit, and two ends of the second resistor in the first temperature compensation circuit are respectively connected to the out-phase input end and an output end of the first operational amplifier in the first temperature compensation circuit. An input end of the first voltage follower in the first temperature compensation circuit is configured to receive the temperature signal generated by the temperature detection circuit in the first temperature compensation circuit, an in-phase input end of the first operational amplifier in the first temperature compensation circuit is configured to receive the reference signal generated by the temperature detection circuit in the first temperature compensation circuit, and the output end of the first operational amplifier in the first temperature compensation circuit is configured to output the first control signal. The second temperature conversion circuit in the first temperature compensation circuit includes a second voltage follower, a second operational amplifier, a third resistor, and a fourth resistor. One end of the third resistor in the first temperature compensation circuit is connected to an output end of the second voltage follower in the first temperature compensation circuit, the other end of the third resistor in the first temperature compensation circuit is connected to an out-phase input end of the second operational amplifier in the first temperature compensation circuit, and two ends of the fourth resistor in the first temperature compensation circuit are respectively connected to the out-phase input end and an output end of the second operational amplifier in the first temperature compensation circuit. An input end of the second voltage follower in the first temperature compensation circuit is configured to receive the reference signal generated by the temperature detection circuit in the first temperature compensation circuit, an in-phase input end of the second operational amplifier in the first temperature compensation circuit is configured to receive the temperature signal generated by the temperature detection circuit in the first temperature compensation circuit, and the output end of the second operational amplifier in the first temperature compensation circuit is configured to output the second control signal in the first temperature compensation circuit.

Optionally, with reference to any one of the thirteenth possible implementation to the nineteenth possible implementation of the second aspect, in a twentieth possible implementation of the second aspect, the variable resistor circuit in the first temperature compensation circuit includes at least two variable resistors connected in parallel, a control end of the variable resistor in the first temperature compensation circuit is controlled by a multiplexer, and through control of the multiplexer in the first temperature compensation circuit, the control signal generated by the temperature conversion circuit in the first temperature compensation circuit is input to the control end of the variable resistor in the first temperature compensation circuit, or a fixed level is input to the control end of the variable resistor in the first temperature compensation circuit.

DESCRIPTION OF EMBODIMENTS

The following describes the embodiments of this application with reference to accompanying drawings.

The term "and/or" in this application may describe an association relationship for describing associated objects and represents that three relationships may exist. For example. A and/or B may represent the following three cases: Only A exists, both A and B exist, and only B exists, where A and B may be singular or plural. In addition, the character "/" in this application usually indicates an "or" relationship between the associated objects. In this application. "at least one" refers to one or more, and "a plurality of" refers to two or more. The expression "at least one of the following items" or a similar expression means any combination of these items, including a single item or any combination of a plurality of items. For example, at least one of a, b, or c may represent a, b, c, a-b, a-c, b-c, or a-b-c, where a, b, and c may be one or more in quantity.

In the specification, claims, and accompanying drawings of this application, the terms "first", "second", and so on are intended to distinguish between similar objects but do not necessarily indicate a specific order or sequence. It should be understood that the terms used in such a way are interchangeable in proper circumstances, and this is merely a discrimination manner that is used when objects having a same attribute are described in the embodiments of this application. In addition, the terms "include". "contain" and any other variants mean to cover the non-exclusive inclusion, so that a process, method, system, product, or device that includes a series of units is not necessarily limited to those units, but may include another unit not expressly listed or inherent to such a process, method, system, product, or device.

Figure 1:
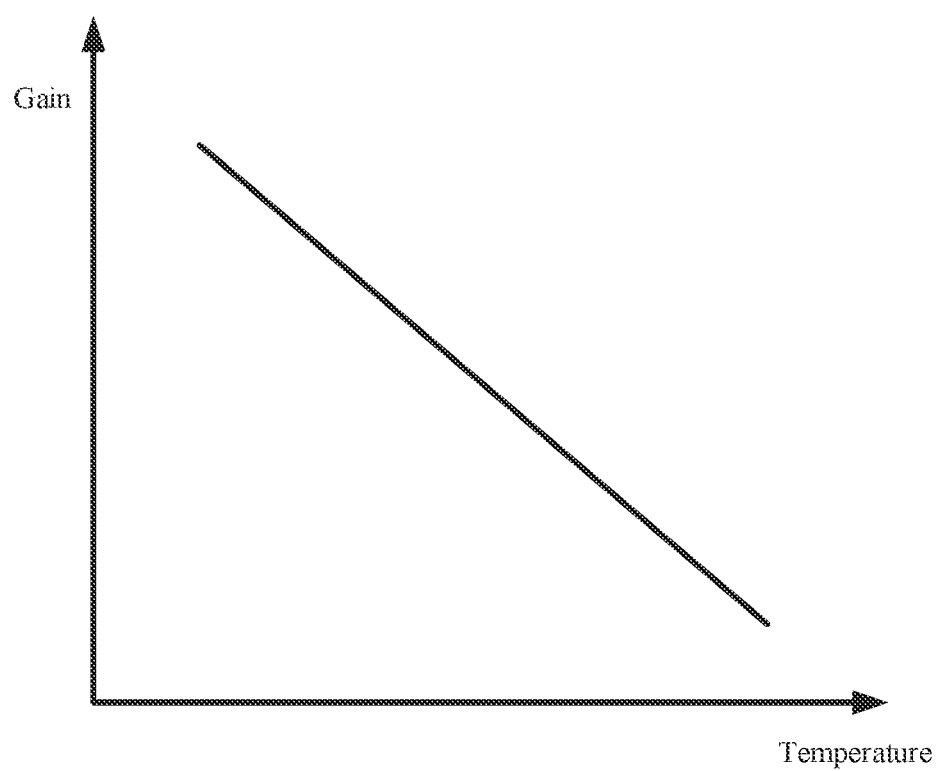
FIG. 1 is a schematic diagram of a curve of changing with a temperature by a gain in a signal processing path.

A signal processing path generally includes a plurality of components connected in series. Each component processes a signal flowing through the signal processing path. The processing generally includes amplifying or attenuating the signal flowing through the signal processing path. Generally, a gain of the component in the signal processing path for the signal gradually decreases with an increasing temperature, as shown in FIG. 1. Moreover, an ambient temperature and operating power consumption of the signal processing path in a working process inevitably change, which usually causes a relatively large temperature fluctuation range of the signal processing path in the working process. As a result, the gain of the signal processing path has a relatively large fluctuation, and stability of signal processing performed by the signal processing path is affected. Especially when the signal processing path processes a microwave signal, a temperature change has more significant impact on the gain of the signal processing path. In this application, for example, the signal processing path may be a radio frequency receive path or a radio frequency transmit path. A person skilled in the art should be aware that, a radio frequency receive channel generally includes elements such as a low noise amplifier, a filter, a variable gain amplifier, and a frequency mixer that are connected in series, and is configured to convert a radio frequency signal into a baseband signal for processing by a modem. On the contrary, a radio frequency transmit channel converts a baseband signal into a radio frequency signal, and finally transmits the radio frequency signal through an antenna.

To reduce the impact of the temperature change on the gain of the signal processing path, temperature compensation needs to be performed for the signal processing path. In the prior art, a module-level temperature compensation solution is usually used. For example, a bias of a type being in a positive correlation with the temperature is used or a load of a type being in a positive correlation with the temperature is used to compensate for a gain change of the signal processing path caused by the temperature. However, temperature compensation capabilities of the two existing module-level compensation solutions are limited. Especially when the signal processing path works in a microwave frequency band, the temperature change significantly affects the gain. Even if both of the two compensation solutions are used, the temperature change still has large impact on the gain in the signal processing path.

To reduce the impact of the temperature change on the gain in the signal processing path, this application provides a temperature compensation circuit. The temperature compensation circuit may be applied to a signal processing path. The temperature compensation circuit is connected to the signal processing path. The temperature compensation circuit is configured to provide a gain change for the signal processing path when a temperature of the signal processing path changes, to compensate for a gain change of the signal processing path caused by the temperature change, and minimize impact of the temperature change on the gain in the signal processing path. The gain change herein is not only used to indicate a gain change amount, but also used to indicate a gain change trend. For ease of description, the gain change provided by the temperature compensation circuit for the signal processing path is referred to as a first gain change, and the gain change of the signal processing path caused by the temperature change is referred to as a second gain change. The first gain change provided by the temperature compensation circuit compensates for the caused second gain change of the signal processing path, a trend of the first gain change is opposite to a trend of the second gain change, and an amount of the first gain change is equal to an amount of the second gain change. It may be understood that if the amount of the first gain change is closer to the amount of the second gain change, the temperature compensation circuit has a better temperature compensation effect on the signal processing path, and the gain of the signal processing path is more stable when the temperature changes. Assuming that the temperature of the signal processing path increases, the gain of the signal processing path usually decreases, and a caused second gain change is a gain decrease. In this case, the temperature compensation circuit may provide a second gain change of a gain increase for the signal processing path, to reduce the gain change of the signal processing path, or even maintain the gain unchanged. For example, when the signal processing path is a radio frequency receive path, the temperature compensation circuit may perform temperature compensation on a radio frequency signal processed in the radio frequency receive path, and may perform temperature compensation on a baseband signal obtained after conversion by the radio frequency receive path.

In actual use, components in the signal processing path may be integrated into one chip, or may be disposed in different chips.

The temperature compensation circuit may be a passive circuit, which hardly increases power consumption of the signal processing path. The following describes, with reference to accompanying drawings, specific implementations of the temperature compensation circuit provided in this application.

Figure 2:
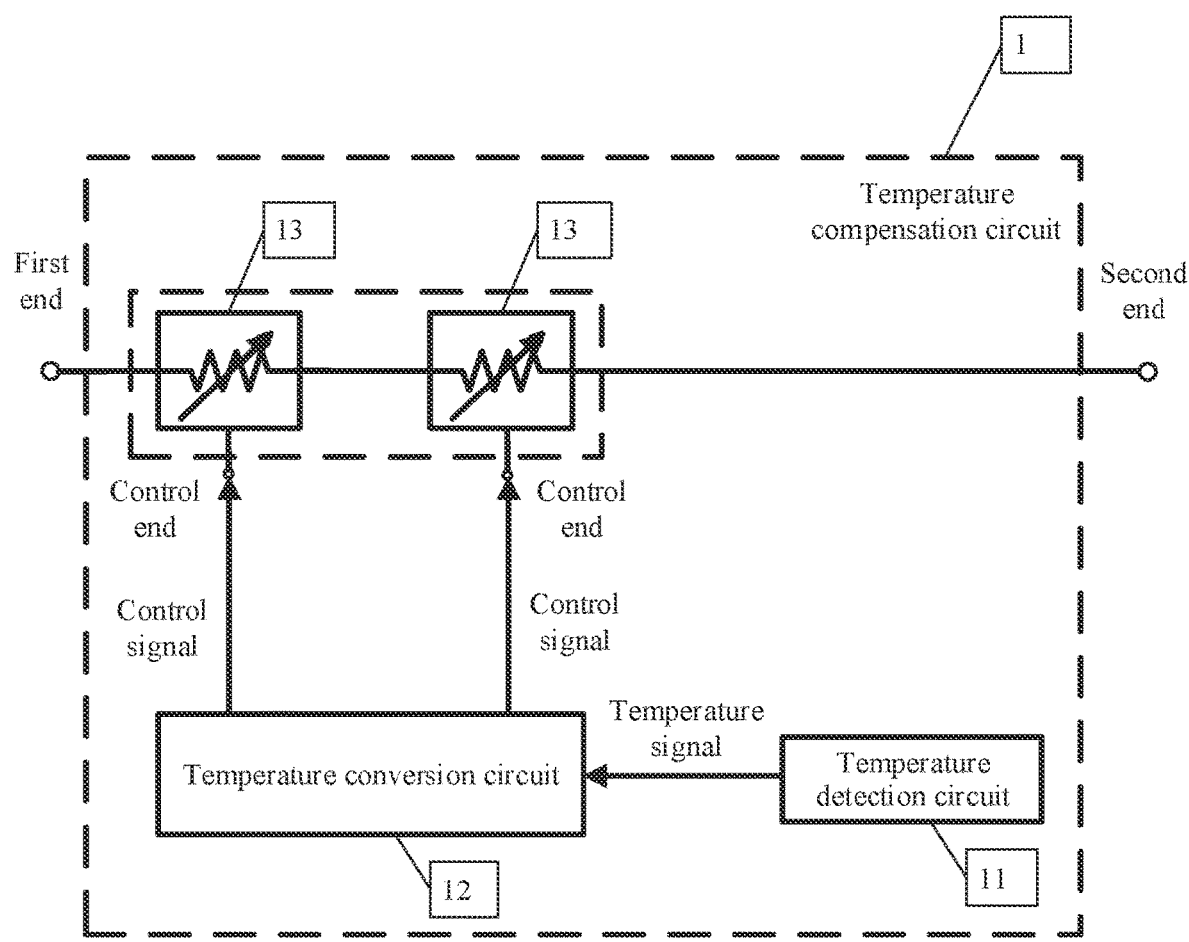
FIG. 2 is a schematic diagram of an embodiment of a temperature compensation circuit according to this application.
Figure 3:
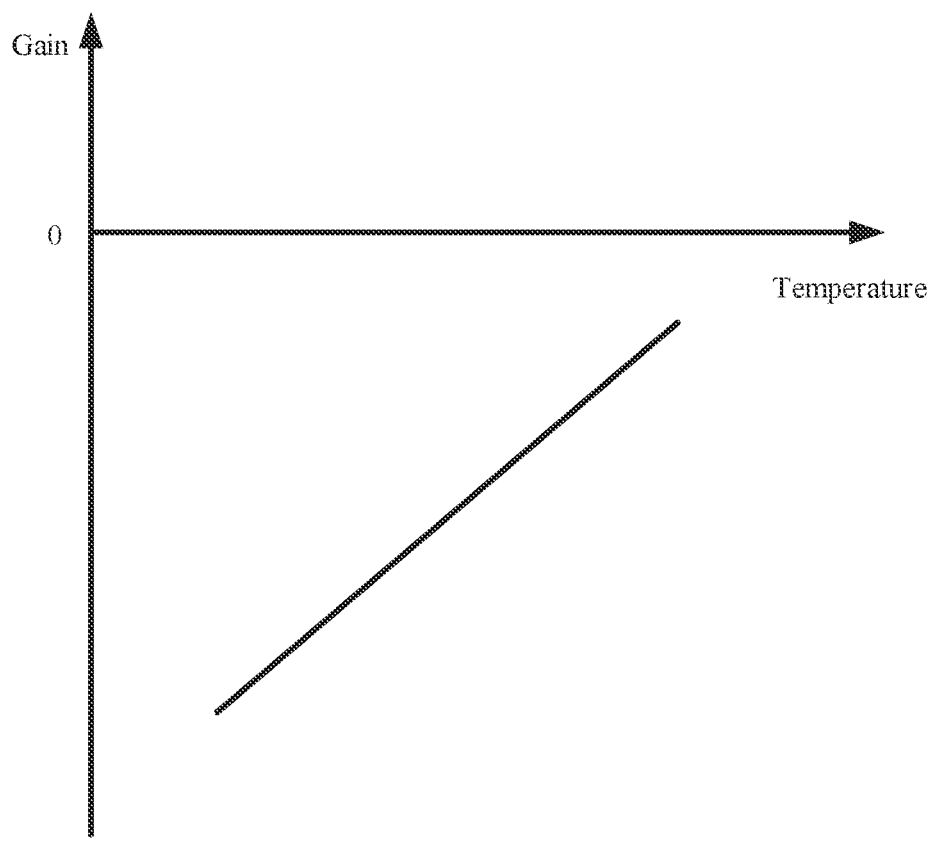
FIG. 3 is a schematic diagram of a curve of changing with a temperature by a gain of a passive variable attenuator according to this application.

Referring to FIG. 2, the temperature compensation circuit 1 may include a temperature detection circuit 11, a passive variable attenuator 13, and a temperature conversion circuit 12. The temperature detection circuit 11 is configured to generate a temperature signal and a reference signal. An output end of the temperature detection circuit 11 is connected to an input end of the temperature conversion circuit 12. The temperature detection circuit 11 may output the temperature signal and the reference signal to the input end of the temperature conversion circuit 12. The temperature signal can be used to represent a high or low temperature. Therefore, the temperature signal monotonically changes with a temperature of a signal processing path. The monotonic change refers to a monotonic increase or a monotonic decrease. If the temperature signal is considered as a function using the temperature as an independent variable, that the temperature signal monotonically increases with the temperature means that the temperature signal gradually strengthens as the temperature increases, and the temperature signal gradually weakens as the temperature decreases. That the temperature signal monotonically decreases with the temperature means that the temperature signal gradually weakens as the temperature increases, and the temperature signal gradually strengthens as the temperature decreases. The temperature conversion circuit 12 is configured to generate a control signal based on the temperature signal and the reference signal. An output end of the temperature conversion circuit 12 is connected to a control end of the passive variable attenuator 13, and the control signal may be output to the control end of the passive variable attenuator 13. The attenuator can attenuate, or in other words, generate a negative gain for, a signal passing through the attenuator. If a value of attenuation generated by the attenuator for the signal decreases, it may also be described as that a gain for the signal increases. The passive variable attenuator 13 is configured to be connected in series in the signal processing path by using a first end and a second end, and adjust, based on the control signal received by using the control end of the passive variable attenuator, an attenuation value of a signal (a signal flowing through the first end and the second end of the passive variable attenuator 13) processed by the signal processing path, to compensate for a gain change of the signal processing path caused by a temperature change. Different from unidirectionality of an active component, the first end of the passive variable attenuator 13 may be used as an input end and an output end, making it especially suitable for application in a time division duplex mobile communications system, so that a signal transmitting path and a signal receiving path in the time division duplex mobile communications system can share a temperature compensation circuit, thereby helping reduce costs and reduce a chip area. In an actual application, one or more passive variable attenuators 13 may be selected to be used in the temperature compensation circuit 1 based on a status of changing with the temperature by the gain in the signal processing path and an attenuation capability of the passive variable attenuator 13. In FIG. 2, two passive variable attenuators 13 are used as an example. If the temperature increases, a second gain change of the signal processing path caused by the temperature change is generally a gain decrease. For a curve of changing with the temperature by the gain in the signal processing path, refer to FIG. 1. In this case, the passive variable attenuator 13 may reduce, under an action of the control signal, the value of attenuation generated for the signal, that is, a first gain change provided by the passive variable attenuator 13 for the signal processing path is a gain increase, to perform temperature compensation for the signal processing path. For a curve of changing with the temperature by the gain of the passive variable attenuator 13, refer to FIG. 3. Because the gain of the passive variable attenuator 13 may be changed with the temperature to perform temperature compensation for the signal processing path, so that the gain of the signal processing path tends to be stable at different temperatures, the curve of changing with the temperature by the gain of the passive variable attenuator 13 may also be referred to as a temperature compensation curve.

The signal processing path generally includes a bandgap reference circuit. The bandgap reference circuit is configured to provide a direct current voltage or a current that is independent of a power supply and a process and that has a determinate temperature characteristic. The determinate temperature characteristic includes a characteristic such as being in direct proportion to the temperature or being independent of the temperature. The most typical bandgap reference circuit generates a voltage that is in direct proportion to the temperature and a voltage that is in inverse proportion to the temperature. Temperature coefficients of the two voltages cancel each other out, to generate a reference voltage independent of the temperature. It can be learned that generally, the bandgap reference circuit may provide a signal that is in direct proportion to the temperature, a signal that is in inverse proportion to the temperature, and a reference signal that is independent of the temperature. Optionally, the temperature detection circuit 11 may include a bandgap reference circuit. To reduce overheads, the temperature detection circuit may reuse the bandgap reference circuit in the signal processing path, to provide a temperature signal in direct or inverse proportion to the temperature and a reference signal by using the bandgap reference circuit. For ease of description, ΔVbe represents the temperature signal, and Vbg represents the reference signal. Alternatively, the temperature detection circuit 11 may include a temperature sensor circuit. The temperature sensor circuit generates a temperature signal based on a detected temperature of the signal processing path. The bandgap reference circuit provides a reference signal. The temperature signal can be used to represent a high or low temperature. Therefore, the temperature signal generated by the temperature sensor monotonically changes with the temperature of the signal processing path. That the temperature signal is in direct proportion to the temperature is a special case in which the temperature signal monotonically increases with the temperature, and that the temperature signal is in inverse proportion to the temperature is a special case in which the temperature signal decreases with the temperature.

After generating the temperature signal and the reference signal, the temperature detection circuit 11 may output the temperature signal and the reference signal to the input end of the temperature conversion circuit 12. The temperature conversion circuit 12 is configured to generate a control signal based on the temperature signal and the reference signal. Then, the control signal may be output to the control end of the passive variable attenuator 13. The control signal is in a linear correlation with the temperature signal. Because the temperature signal monotonically changes with the temperature, the control signal also monotonically changes with the temperature. A monotonic temperature compensation curve may be implemented within a specific temperature range by selecting a proper change range of the control signal. It is assumed that the control signal is a voltage signal and is denoted as V1, and the temperature signal and the reference signal that are output by the temperature detection circuit 11 to the temperature conversion circuit 12 are respectively ΔVbe and Vbg. Then, V1=mΔVbe+nVbg.

Figure 4:
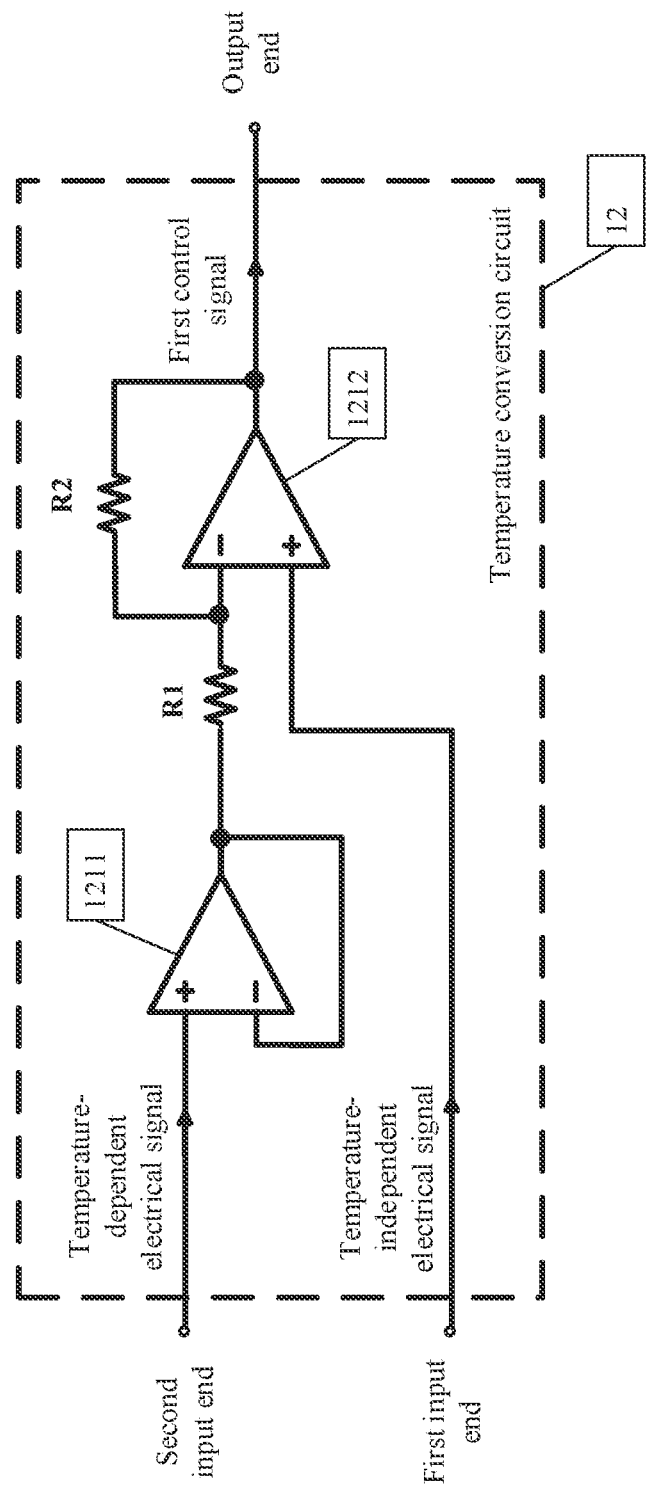
FIG. 4 is a schematic diagram of an embodiment of a first temperature conversion circuit in a temperature compensation circuit according to this application.

Optionally, referring to FIG. 4, the temperature conversion circuit 12 may include a first input end, a second input end, a first voltage follower 1211, a first operational amplifier 1212, a first resistor R1, and a second resistor R2. The reference signal is connected to an out-phase input end of the first operational amplifier 1212 via the first input end. The temperature signal is connected to an in-phase input end of the first operational amplifier 1212 via the second input end and successively through the first voltage follower 1211 and the first resistor R1. The in-phase input end of the first operational amplifier 1212 is connected to an output end of the first operational amplifier 1212 by using the second resistor R2. The first operational amplifier 1212 inputs the control signal V1 to the control end of the passive variable attenuator 13 by using the output end of the first operational amplifier. It is assumed that the temperature signal and the reference signal that are output by the temperature detection circuit 11 to the temperature conversion circuit 12 are respectively ΔVbe and Vbg.

Then, $$V1 = \left(1 + \frac{R2}{R1}\right)Vbg - \frac{R2}{R1}\Delta Vbe.$$

Figure 5:
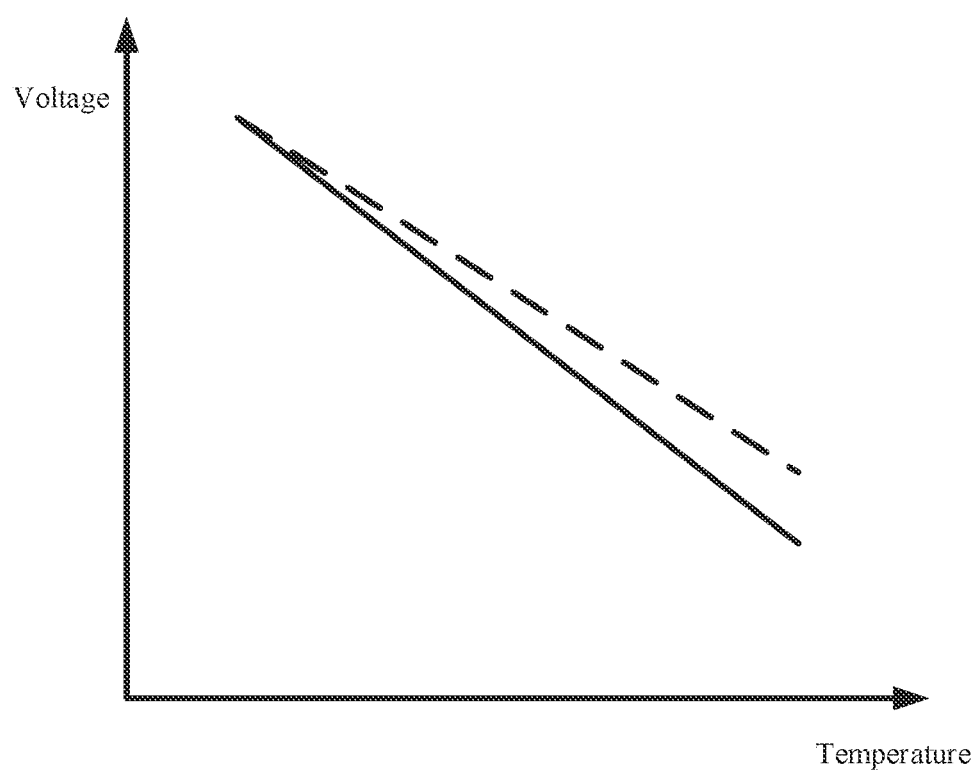
FIG. 5 is a schematic diagram of a curve of changing with a temperature by a first control signal according to this application.
Figure 6:
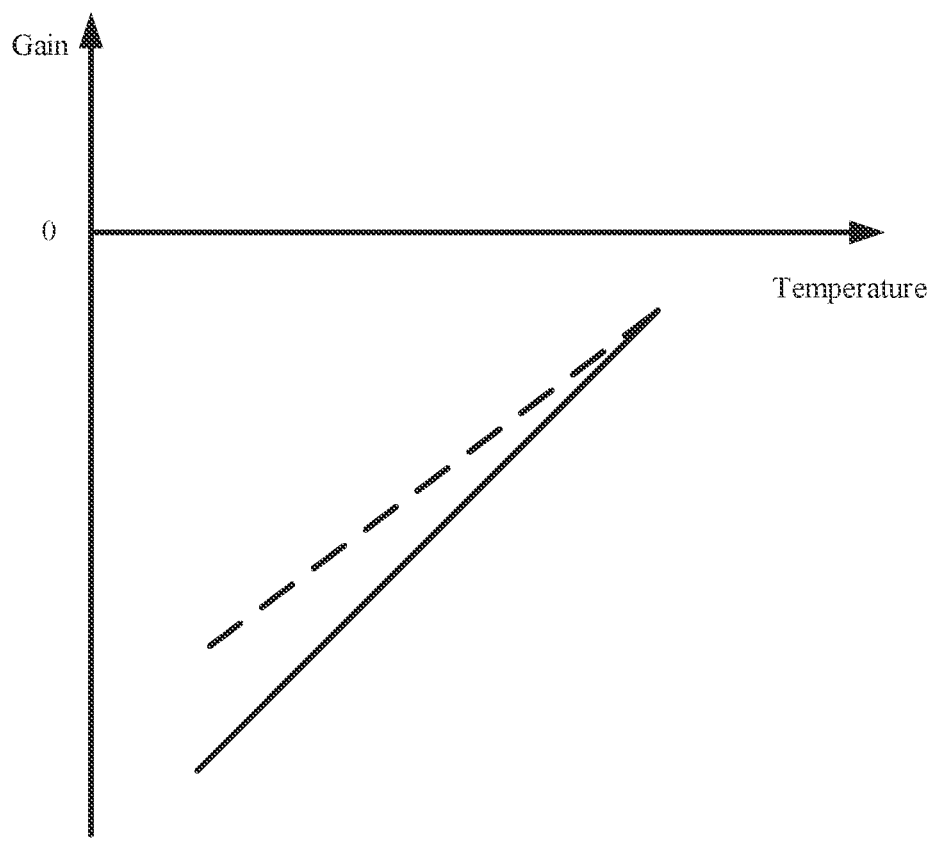
FIG. 6 is a schematic diagram of a temperature compensation curve according to this application.

A proper change curve of the control signal may be obtained by setting proper values of R1 and R2, so that the passive variable attenuator 13 implements a monotonic temperature compensation curve within a specific temperature range. When a process change causes a change in the curve of changing with the temperature by the gain of the signal processing path, the temperature compensation curve of the temperature compensation circuit 1 needs to be correspondingly adjusted, which, for the temperature compensation circuit 1 mentioned in this application, may be implemented by changing the curve of changing with the temperature by the control signal. To change the curve of changing with the temperature by the control signal, a ratio of R1 to R2 may be adjusted. To avoid increasing an insertion loss additionally introduced by the temperature compensation circuit 1 to the signal processing path, a control signal corresponding to the highest working temperature may be retained unchanged. When the curve of changing with the temperature by the control signal is shown by a solid line in FIG. 5, for the temperature compensation curve of the temperature compensation circuit 1, refer to a solid line in FIG. 6. When the curve of changing with the temperature by the control signal is shown by a dashed line in FIG. 5, for the temperature compensation curve of the temperature compensation circuit 1, refer to a dashed line in FIG. 6. It can be learned that after a slope of the curve of changing with the temperature by the control signal decreases, within a same temperature range, a slope of the temperature compensation curve of the temperature compensation circuit 1 also decreases correspondingly.

It should be noted that, to increase a controllable change range of V1, the temperature signal ΔVbe and/or the reference signal Vbg may pass through a multiplier circuit before being input to the temperature conversion circuit 12.

Figure 7:
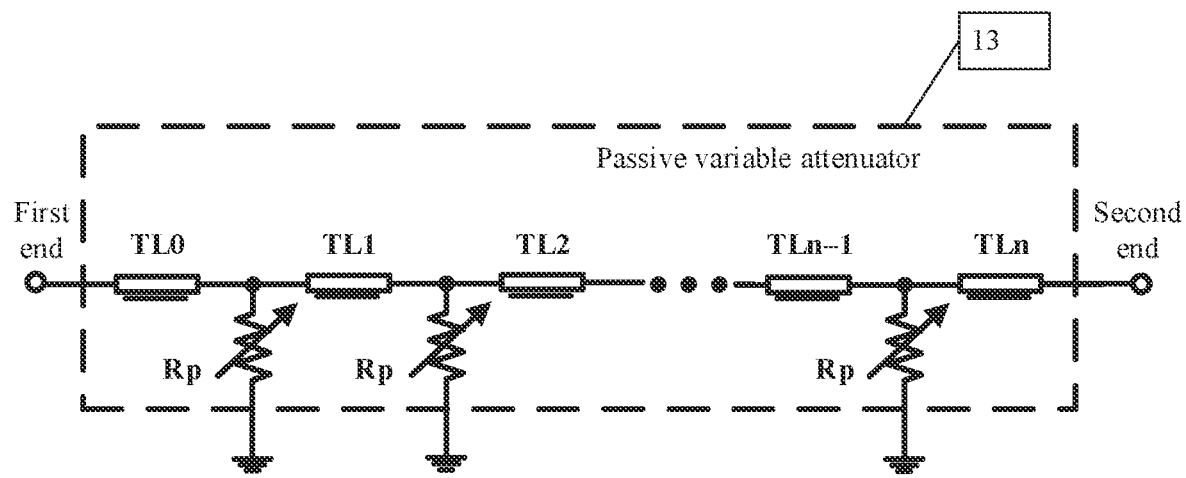
FIG. 7 is a schematic diagram of an embodiment of a passive variable attenuator in a temperature compensation circuit according to this application.

The passive variable attenuator 13 may be a distributed attenuation structure. For example, FIG. 7 is a schematic structural diagram of a distributed passive variable attenuator 13. The passive variable attenuator 13 may include one series branch and n parallel branches. The series branch includes n+1 transmission lines TL0 to TLn. Each parallel branch includes a variable resistor Rp, and n variable resistors Rp are isolated from each other by using the n+1 transmission lines TL0 to TLn. Specifically, each node between every two adjacent transmission lines is connected to one end of a parallel branch, and the other end of the parallel branch is grounded. The series branch is configured to be connected in series in the signal processing path. Specifically, assuming that the passive variable attenuator is connected in the signal processing path by using a first end and a second end, and attenuates signals that flow through the first end and the second end in the signal processing path, the series branch is connected in series between the first end and the second end. The variable resistor circuit may be an electrically controlled variable resistor, and may be generally implemented by using a metal-oxide-semiconductor field-effect transistor (MOSFET), a bipolar junction transistor (BJT), or the like. The first operational amplifier 1212 may input the control signal to a control end of the variable resistor circuit Rp of the parallel branch of the passive variable attenuator 13 by using the output end of the first operational amplifier. Equivalent resistance of the variable resistor circuit Rp in the passive variable attenuator 13 can be changed by adjusting the control signal, to change a signal attenuation value of the passive variable attenuator 13, and provide a first gain change for the signal processing path, to compensate for a second gain change of the signal processing path caused by a temperature change.

Figure 8:
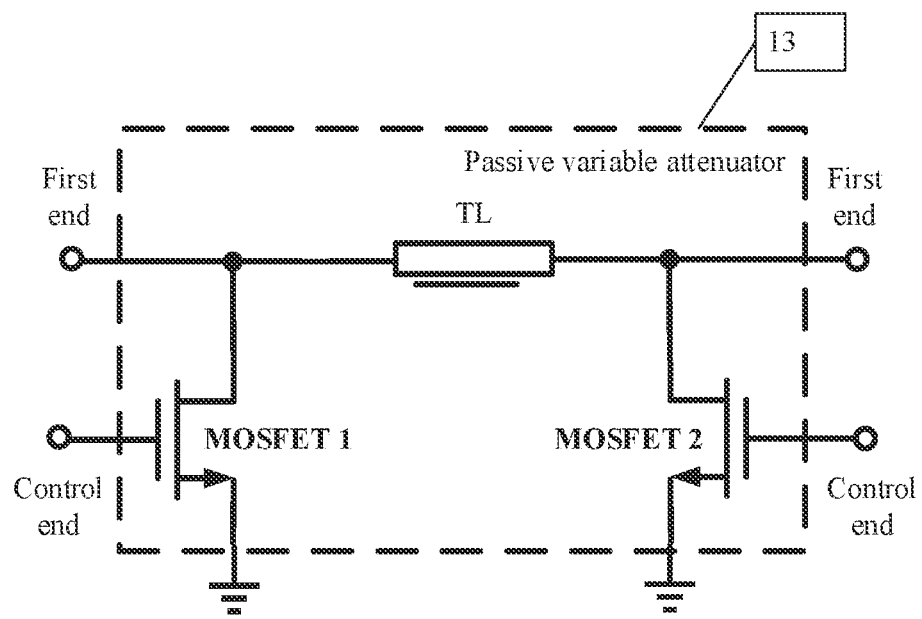
FIG. 8 is a schematic diagram of another embodiment of a passive variable attenuator in a temperature compensation circuit according to this application.

Based on the passive variable attenuator 13 shown in FIG. 7, a Pi-type distributed passive variable attenuator including two parallel branches whose variable resistor circuit is a MOSFET is used as an example. FIG. 8 is another schematic structural diagram of the distributed passive variable attenuator 13. MOSFET 1 and MOSFET 2 are each connected in series in a parallel branch by using a source and a drain. Gates of MOSFET 1 and MOSFET 2 serve as control ends of the passive variable attenuator 13, and may receive the control signal input by the temperature conversion circuit 12.

Figure 9:
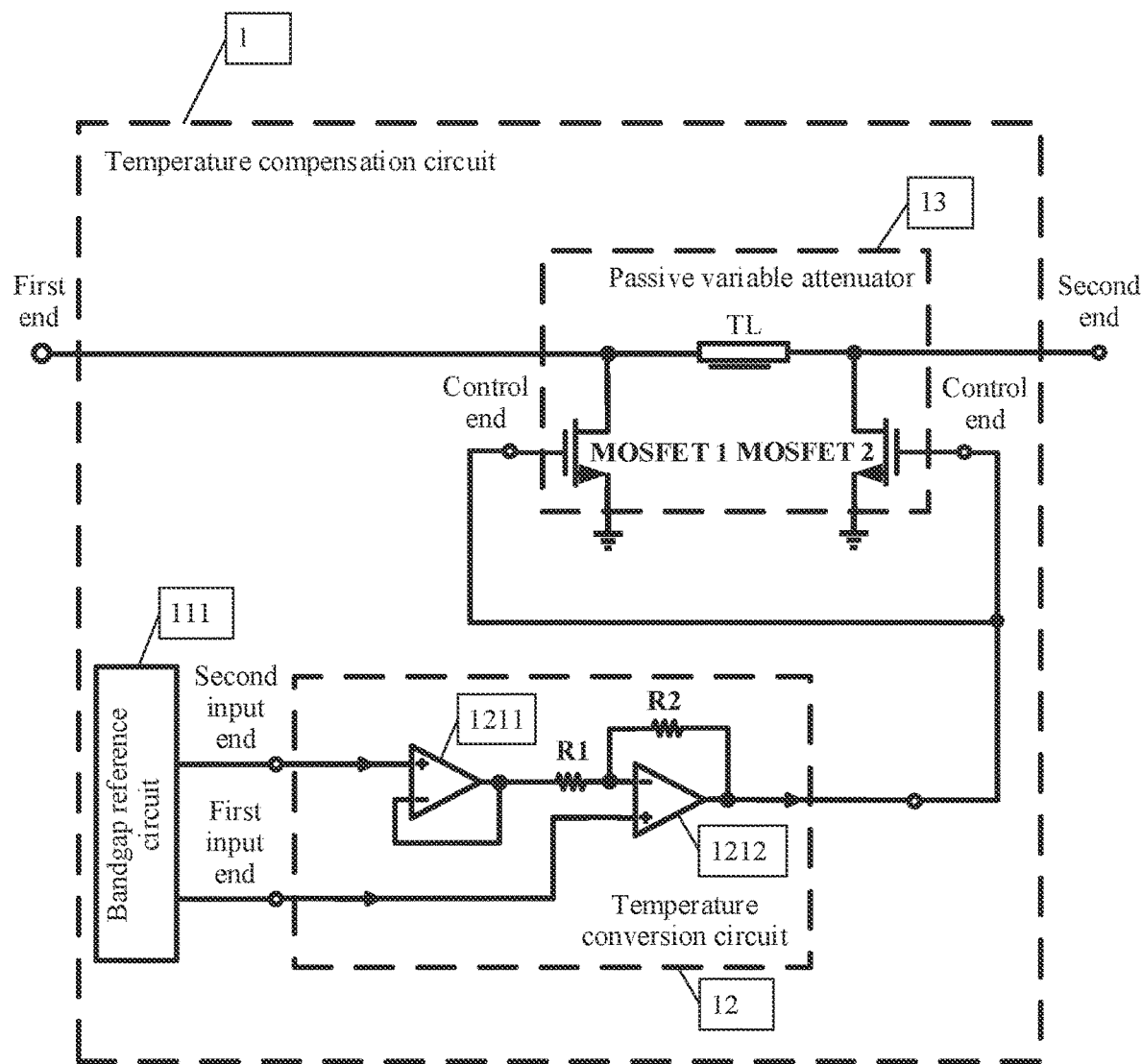
FIG. 9 is a schematic diagram of another embodiment of a temperature compensation circuit according to this application.

In a possible implementation, referring to FIG. 9, the temperature compensation circuit 1 provided in this application may include a bandgap reference circuit 111, a temperature conversion circuit 12, and a passive variable attenuator 13. The bandgap reference circuit provides a temperature signal ΔVbe with a positive temperature coefficient, and outputs ΔVbe to a second input end of the temperature conversion circuit 12. The bandgap reference circuit may further provide a reference signal Vbg that does not change with a temperature, and outputs Vbg to a first input end of the temperature conversion circuit 12. For a specific structure of the first temperature conversion circuit, refer to the foregoing corresponding description of FIG. 4. Details are not described herein again. The first temperature conversion circuit generates a control signal V1 based on ΔVbe and Vbg, and outputs V1 to a control end of the passive variable attenuator 13. For a specific structure of the passive variable attenuator, refer to the foregoing corresponding description of FIG. 8. Details are not described herein again.

Figure 10:
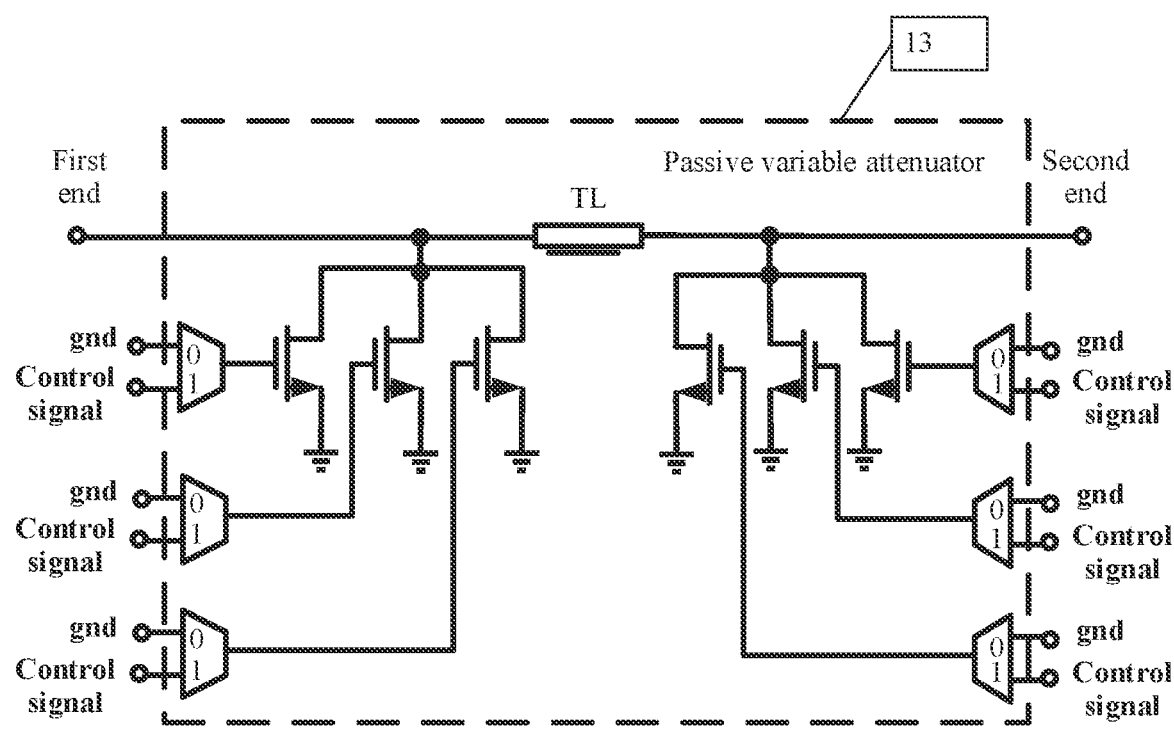
FIG. 10 is a schematic diagram of another embodiment of a passive variable attenuator in a temperature compensation circuit according to this application.

When a process change causes a change in a curve of changing with the temperature by a gain of a signal processing path, a temperature compensation curve of the temperature compensation circuit 1 needs to be correspondingly adjusted, to perform temperature compensation for the signal processing path, which may be completed by changing a curve of changing with the temperature by the control signal, or may be implemented by adjusting an attenuation capability of the passive variable attenuator 13. At a same temperature, a stronger attenuation capability indicates a larger value of attenuation generated by the passive variable attenuator 13 for a signal; otherwise, a value of attenuation generated for a signal is smaller. For example, a variable resistor circuit in the distributed passive variable attenuator 13 may include at least two variable resistors connected in parallel. A control end of each variable resistor is controlled by a multiplexer, and through control of the multiplexer, the control signal output by the temperature conversion circuit 12 is input to the control end of the variable resistor, or a fixed level is input to the control end of the variable resistor. The attenuation capability of the passive variable attenuator 13 may be changed by using the multiplexer by changing a quantity of variable resistors connected to an output end of the temperature conversion circuit 12, to change the temperature compensation curve of the temperature compensation circuit 1. For example, based on the passive variable attenuator 13 shown in FIG. 7, the distributed passive variable attenuator 13 includes two parallel branches, and a variable resistor circuit of the parallel branch includes three MOSFETs connected in parallel. Referring to FIG. 10, in each parallel branch, each MOSFET in the variable resistor circuit is connected in parallel between a node of the series branch and a ground level by using a source and a drain, a gate of the MOSFET serves as a control end of the passive variable attenuator 13, and through control of a multiplexer, the control signal output by the temperature conversion circuit 12 is input to the control end, or a fixed level (the fixed level may be the ground level gnd) is input to the control end. When the attenuation capability of the passive variable attenuator 13 needs to be lowered, a quantity of MOSFETs connected to the control signal output by the temperature conversion circuit 12 may be reduced, and a MOSFET that is not connected to the control signal output by the temperature conversion circuit 12 is connected to the fixed level (usually the ground level). Otherwise, when the attenuation capability of the passive variable attenuator 13 needs to be enhanced, the quantity of MOSFETs connected to the control signal output by the temperature conversion circuit 12 may be increased, and a MOSFET that is not connected to the control signal output by the temperature conversion circuit 12 is still connected to the fixed level (usually the ground level). The process of adjusting the temperature compensation curve of the temperature compensation circuit 1 can be simplified by adjusting the attenuation capability of the passive variable attenuator 13 by using the multiplexer.

Figure 11:
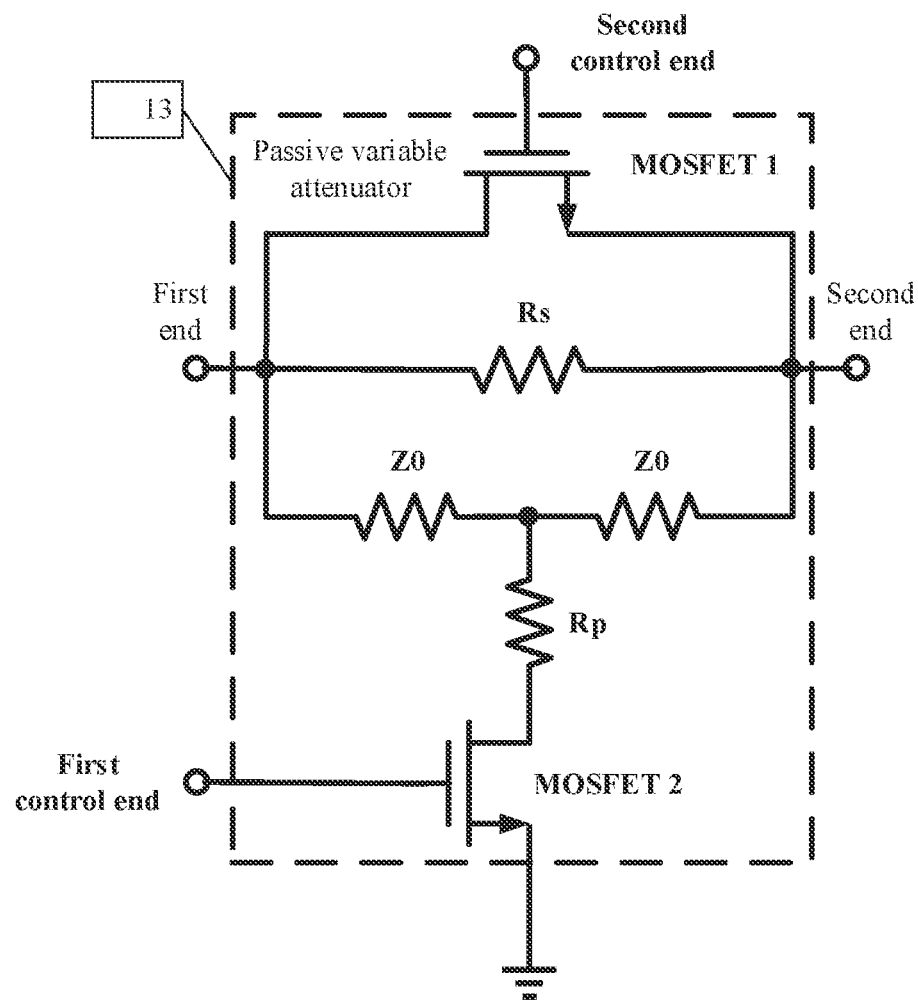
FIG. 11 is a schematic diagram of another embodiment of a passive variable attenuator in a temperature compensation circuit according to this application.

Optionally, the passive variable attenuator 13 may alternatively be an embedded switch-mode attenuator structure. Common embedded switch-mode attenuators generally have three types: a Pi-type structure, a T-type structure, and a bridge T-type structure. For example, the embedded switch-mode passive variable attenuator 13 is the bridge T-type structure. FIG. 11 is a schematic structural diagram of the passive variable attenuator 13. The passive variable attenuator 13 includes one parallel branch and three series branches connected in parallel between a first end and a second end, a first series branch may include two resistors Z0 connected in series, a second series branch includes a resistor Rs, and a third series branch includes a variable resistor, which is generally a MOSFET. For ease of description, the MOSFET in the third series branch is referred to as MOSFET 1. MOSFET 1 is connected in series in the third series branch by using a source and a drain, and a gate of MOSFET 1 of the series branch is used as a second control end of the passive variable attenuator 13. The parallel branch includes a variable resistor and a fixed resistor Rp that are connected in series, and the variable resistor is generally a MOSFET. For ease of description, the MOSFET in the parallel branch is referred to as MOSFET 2. MOSFET 2 is connected in series in the parallel branch by using a source and a gate, and the gate of MOSFET 2 serves as a first control end of the passive variable attenuator 13. The three series branches connected in parallel between the first end and the second end are configured to be connected in series in the signal processing path. Specifically, assuming that the passive variable attenuator is connected in series in the signal processing path by using the first end and the second end, and attenuates signals in the signal processing path that flow through the three parallel series branches via the first end and the second end, two ends of each series branch are connected to the first end and the second end respectively. One end of the parallel branch is connected to a node between the two resistors Z0 in the first series branch, and the other end of the parallel branch is grounded. The passive variable attenuator 13 receives, through the first control end and the second control end, control signals input by the temperature conversion circuit 12.

The first control end and the second control end of the embedded switch-mode passive variable attenuator 13 are generally controlled by a pair of voltage signals inverted to each other. When a control signal input to the first control end decreases, a control signal input to the second control end increases. Therefore, the temperature conversion circuit 12 needs to simultaneously provide a pair of voltage signals inverted to each other to the embedded switch-mode passive variable attenuator 13. To this end, the temperature conversion circuit 12 may include a first temperature conversion circuit 121 and a second temperature conversion circuit 122. The first temperature conversion circuit 121 is configured to generate a first control signal based on the temperature signal and the reference signal, and output the first control signal to the first control end of the passive variable attenuator 13. The second temperature conversion circuit 122 is configured to generate a second control signal based on the temperature signal and the reference signal, and output the second control signal to the second control end of the passive variable attenuator 13. Both the first control signal and the second control signal are in a linear correlation with the temperature signal, and a trend of changing with the temperature by the second control signal is opposite to a trend of changing with the temperature by the first control signal. A monotonic temperature compensation curve may be implemented within a specific temperature range by selecting a proper change range of the first control signal and the second control signal. It is assumed that both the first control signal and the second control signal are voltage signals, which are respectively denoted as V1 and V2, the bandgap reference circuit 111 may output the temperature signal and the reference signal to the first temperature conversion circuit 121 and the second temperature conversion circuit 122, and the temperature signal and the reference signal are respectively $\Delta Vbe$ and $Vbg$. Then, $V1 = m\Delta Vbe + nVbg$, $V2 = p\Delta Vbe + qVbg$, and $m \times p < 0$.

Figure 12:
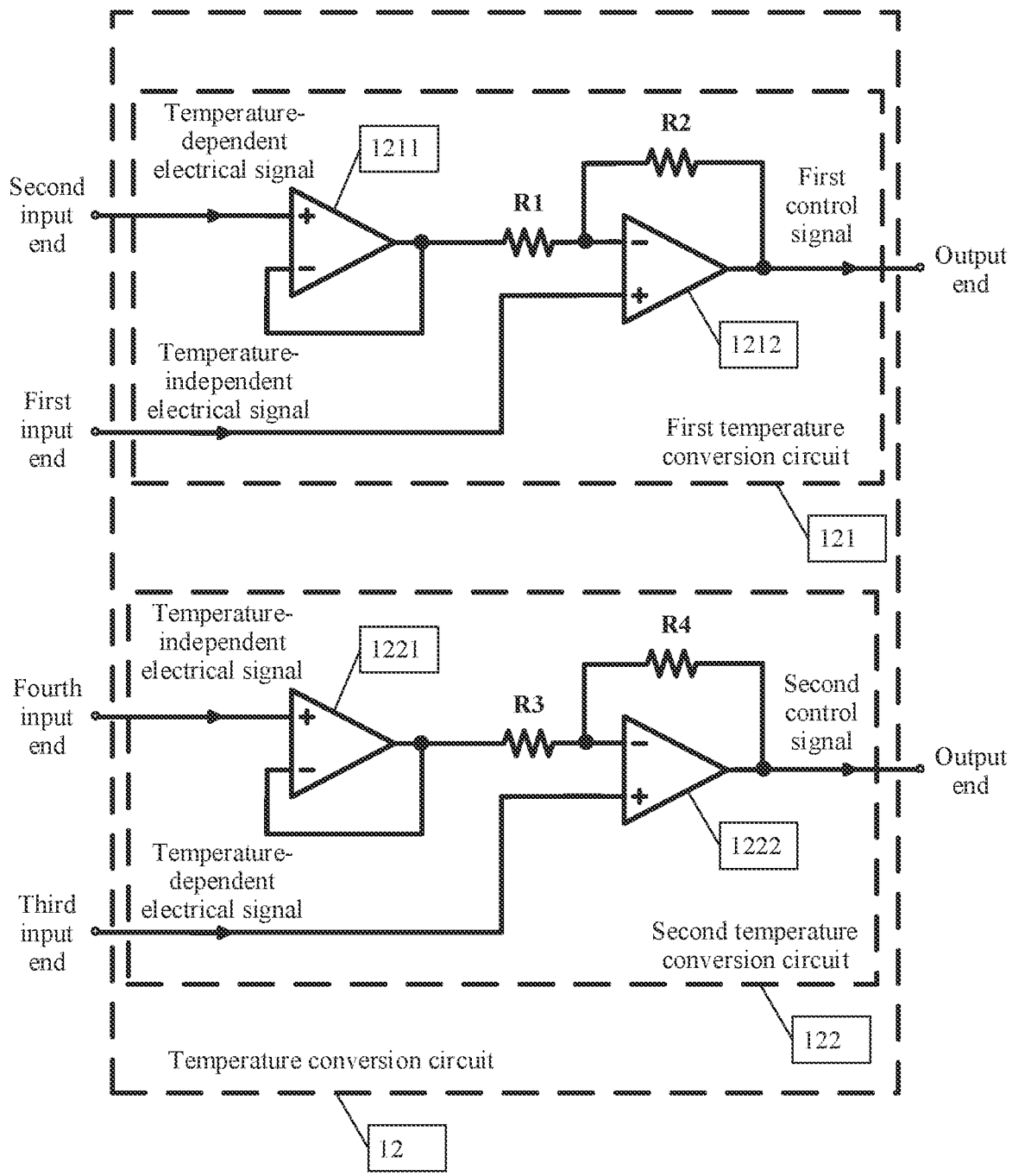
FIG. 12 is a schematic diagram of an embodiment of a second temperature conversion circuit in a temperature compensation circuit according to this application.

For a specific structure of the temperature conversion circuit 12, refer to FIG. 12. For descriptions of the first temperature conversion circuit 121, refer to related descriptions corresponding to FIG. 4. Details are not described herein again. The second temperature conversion circuit 122 may include a third input end, a fourth input end, a second voltage follower 1221, a second operational amplifier 1222, a third resistor R3, and a fourth resistor R4. The temperature signal is connected to an out-phase input end of the second operational amplifier 1222 via the third input end. The reference signal is connected to an in-phase input end of the second operational amplifier 1222 via the fourth input end and successively through the second voltage follower 1221 and the third resistor R3. The in-phase input end of the second operational amplifier 1222 is connected to an output end of the second operational amplifier 1222 by using the fourth resistor R4. The second operational amplifier 1222 inputs the second control signal V2 to the control end of the passive variable attenuator 13 by using the output end of the second operational amplifier.

Then, $$V2 = -\frac{R4}{R3}Vbg + \left(1 + \frac{R4}{R3}\right)\Delta Vbe.$$

Figure 13:
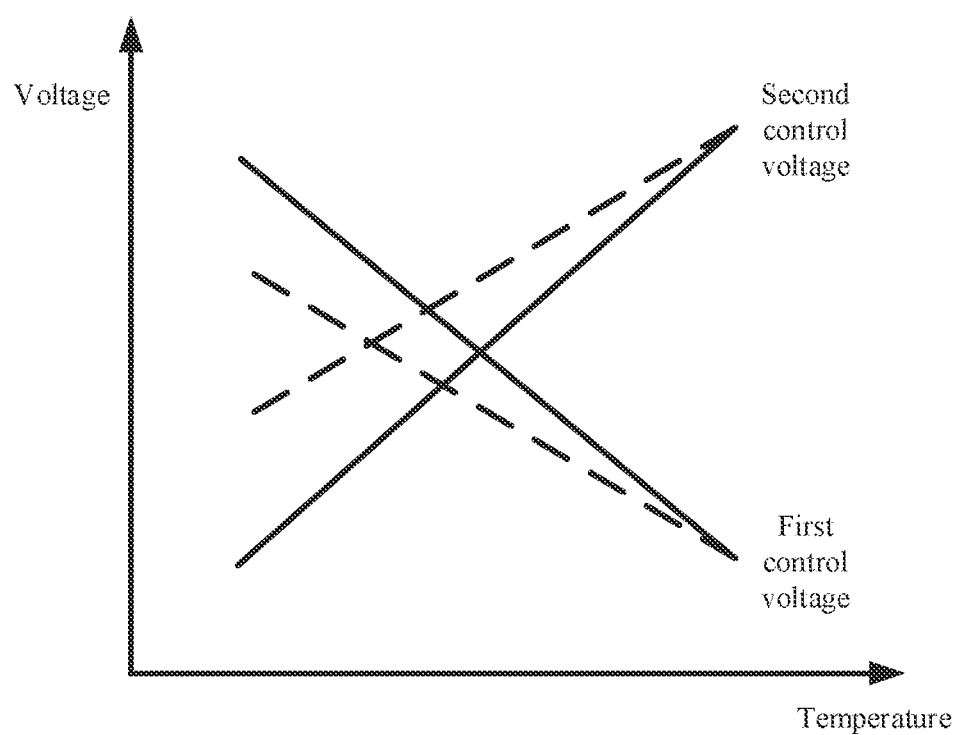
FIG. 13 is a schematic diagram of curves of changing with a temperature by a first control signal and a second control signal according to this application.
Figure 14:
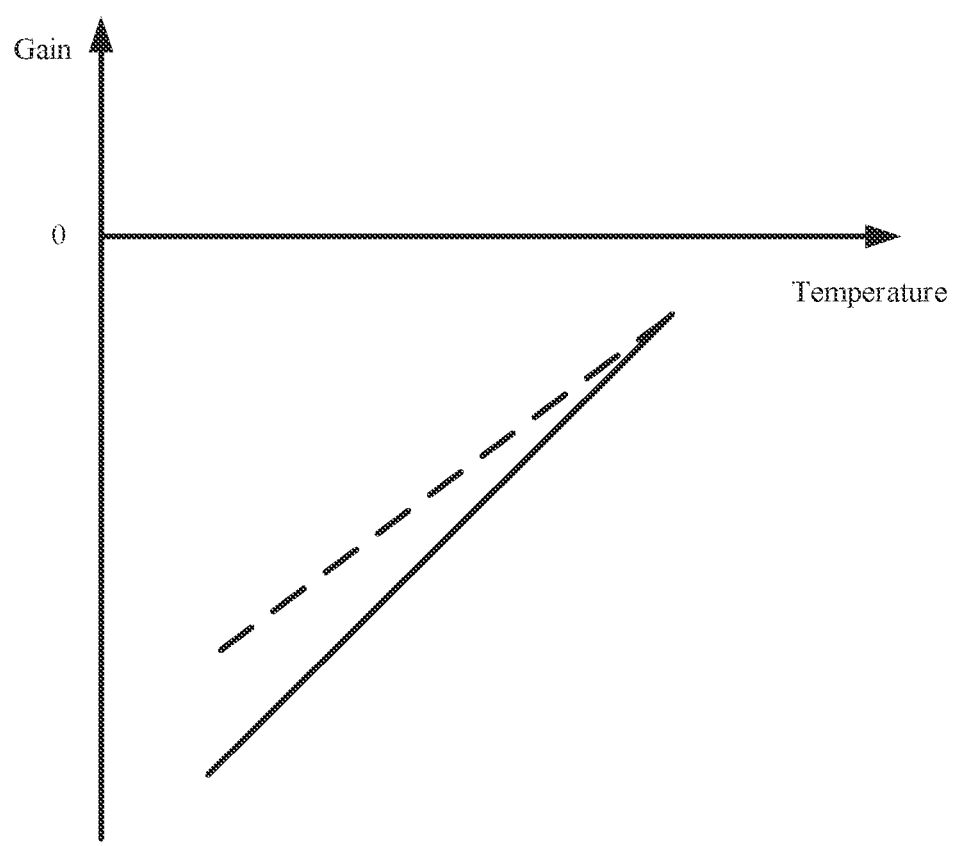
FIG. 14 is a schematic diagram of a temperature compensation curve according to this application.

Proper change curves of the first control signal and the second control signal may be obtained by setting proper values of R1, R2, R3, and R4, so that the passive variable attenuator 13 implements a monotonic temperature compensation curve within a specific temperature range. When a process change causes a change in the curve of changing with the temperature by the gain of the signal processing path, the temperature compensation curve of the temperature compensation circuit 1 needs to be correspondingly adjusted, which, for the temperature compensation circuit 1 mentioned in this application, may be implemented by changing curves of changing with the temperature by the first control signal and the second control signal. To change the curves of changing with the temperature by the first control signal and the second control signal, values of R1, R2, R3, and R4 may be adjusted. To avoid increasing an insertion loss additionally introduced by the temperature compensation circuit 1 to the signal processing path, a first control signal and a second control signal that correspond to the highest working temperature may be retained unchanged. When the curves of changing with the temperature by the first control signal and the second control signal are shown by solid lines in FIG. 13, for the temperature compensation curve of the temperature compensation circuit 1, refer to a solid line in FIG. 14. When the curves of changing with the temperature by the first control signal and the second control signal are shown by dashed lines in FIG. 13, for the temperature compensation curve of the temperature compensation circuit 1, refer to a dashed line in FIG. 14. It can be learned that after slopes of the curves of changing with the temperature by the first control signal and the second control signal decrease, within a same temperature range, a slope of the temperature compensation curve of the temperature compensation circuit 1 also decreases correspondingly.

It should be noted that, to increase a controllable change range of V1 and V2, the temperature signal $\Delta Vbe$ and/or the reference signal $Vbg$ may pass through a multiplier circuit before being input to the first temperature conversion circuit 121.

Figure 15:
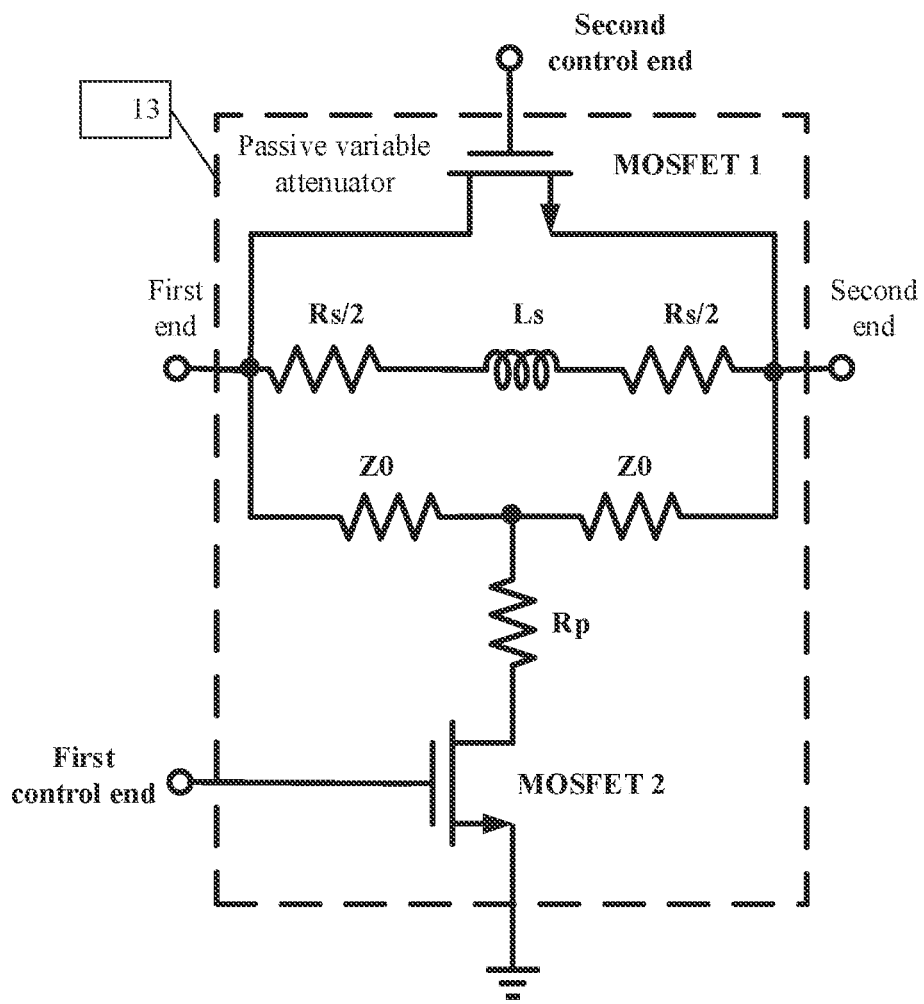
FIG. 15 is a schematic diagram of another embodiment of a passive variable attenuator in a temperature compensation circuit according to this application.

Optionally, a series branch of the embedded switch-mode passive variable attenuator 13 may further include a phase compensation inductor Ls. Referring to FIG. 15, the second series branch of the embedded switch-mode passive variable attenuator 13 includes two fixed resistors Rs/2 and one phase compensation inductor Ls that are connected in series. The phase compensation inductor Ls is disposed between the two fixed resistors Rs/2, and the phase compensation inductor Ls is configured to maintain a constant phase of the passive variable attenuator 13 in cases of different attenuation values.

Figure 16:
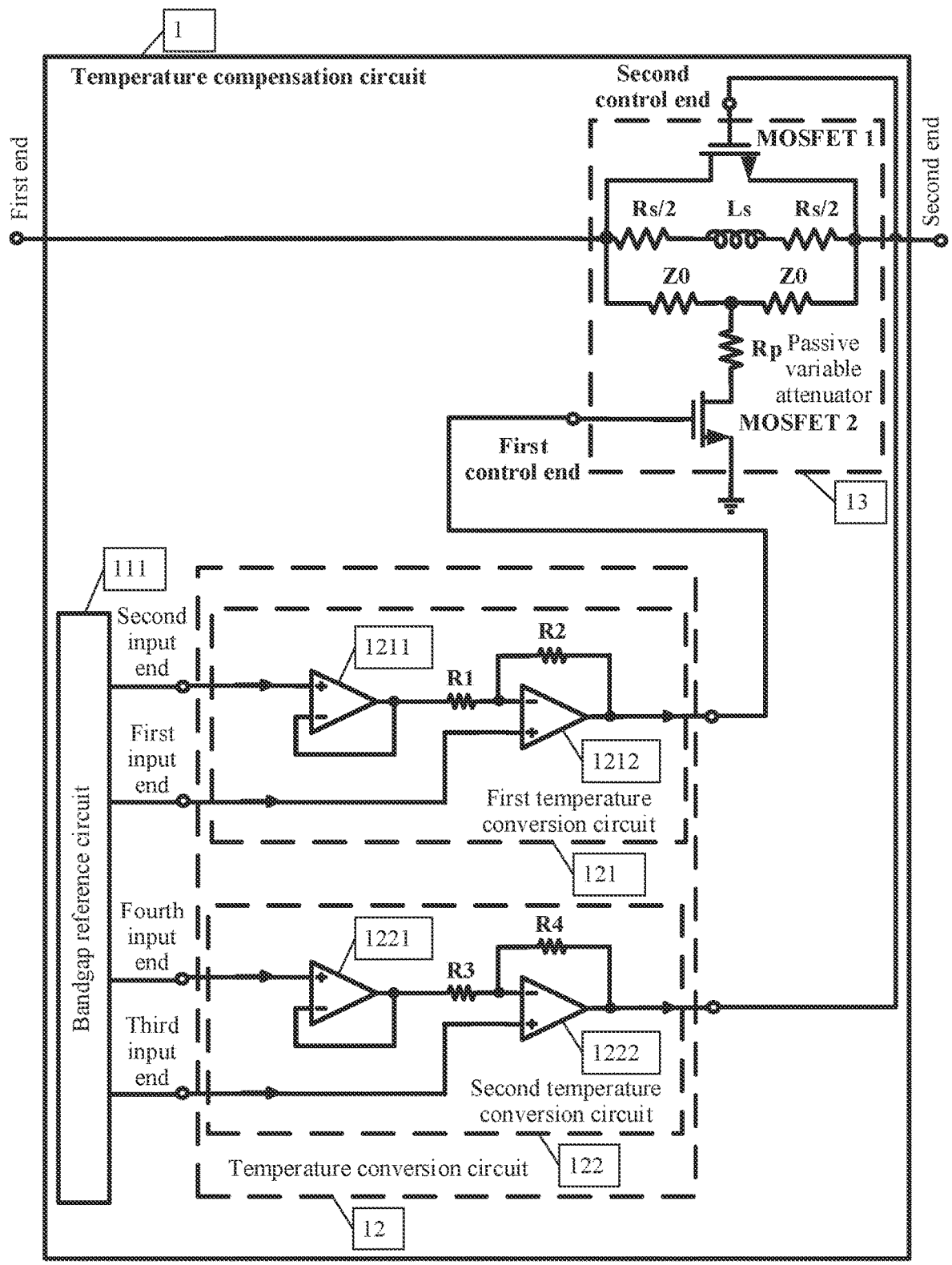
FIG. 16 is a schematic diagram of another embodiment of a temperature compensation circuit according to this application.

In a possible implementation, referring to FIG. 16, the temperature compensation circuit 1 provided in this application may include a bandgap reference circuit 111, a first temperature conversion circuit 121, a second temperature conversion circuit 122, and a passive variable attenuator 13. The bandgap reference circuit provides a temperature signal $\Delta Vbe$ with a positive temperature coefficient, and outputs $\Delta Vbe$ to a second input end of the first temperature conversion circuit 121 and a third input end of the second temperature conversion circuit 122. The bandgap reference circuit may further provide a reference signal $Vbg$ that does not change with a temperature, output $Vbg$ to a first input of the first temperature conversion circuit 121 and a fourth input of the second temperature conversion circuit 122. For specific structures of the first temperature conversion circuit 121 and the second temperature conversion circuit 122, refer to the foregoing corresponding descriptions of FIG. 4 and FIG. 12 respectively. Details are not described herein again.

The first temperature conversion circuit 121 generates a first control signal V1 based on ΔVbe and Vbg. and outputs V1 to a first control end of the passive variable attenuator 13. The second temperature conversion circuit 122 generates a second control signal V2 based on ΔVbe and Vbg, and outputs V2 to a second control end of the passive variable attenuator 13. The passive variable attenuator is connected in series in a signal processing path by using a first end and a second end, and is configured to attenuate signals flowing through the first end and the second end. For a specific structure of the passive variable attenuator, refer to the corresponding description of FIG. 15. Details are not described herein again.

A first operational amplifier 1212 of the first temperature conversion circuit 121 inputs the first control signal to the first control end of MOSFET 2 of a parallel branch of the passive variable attenuator 13 by using an output end of the first operational amplifier. A second operational amplifier 1222 of the second temperature conversion circuit 122 inputs the second control signal to a second control end of MOSFET 1 of a series branch of the passive variable attenuator 13 by using an output end of the second operational amplifier. A signal attenuation value of the passive variable attenuator 13 can be changed by adjusting the first control signal and the second control signal, to provide a first gain change for the signal processing path, to compensate for a second gain change of the signal processing path caused by a temperature change.

Figure 17:
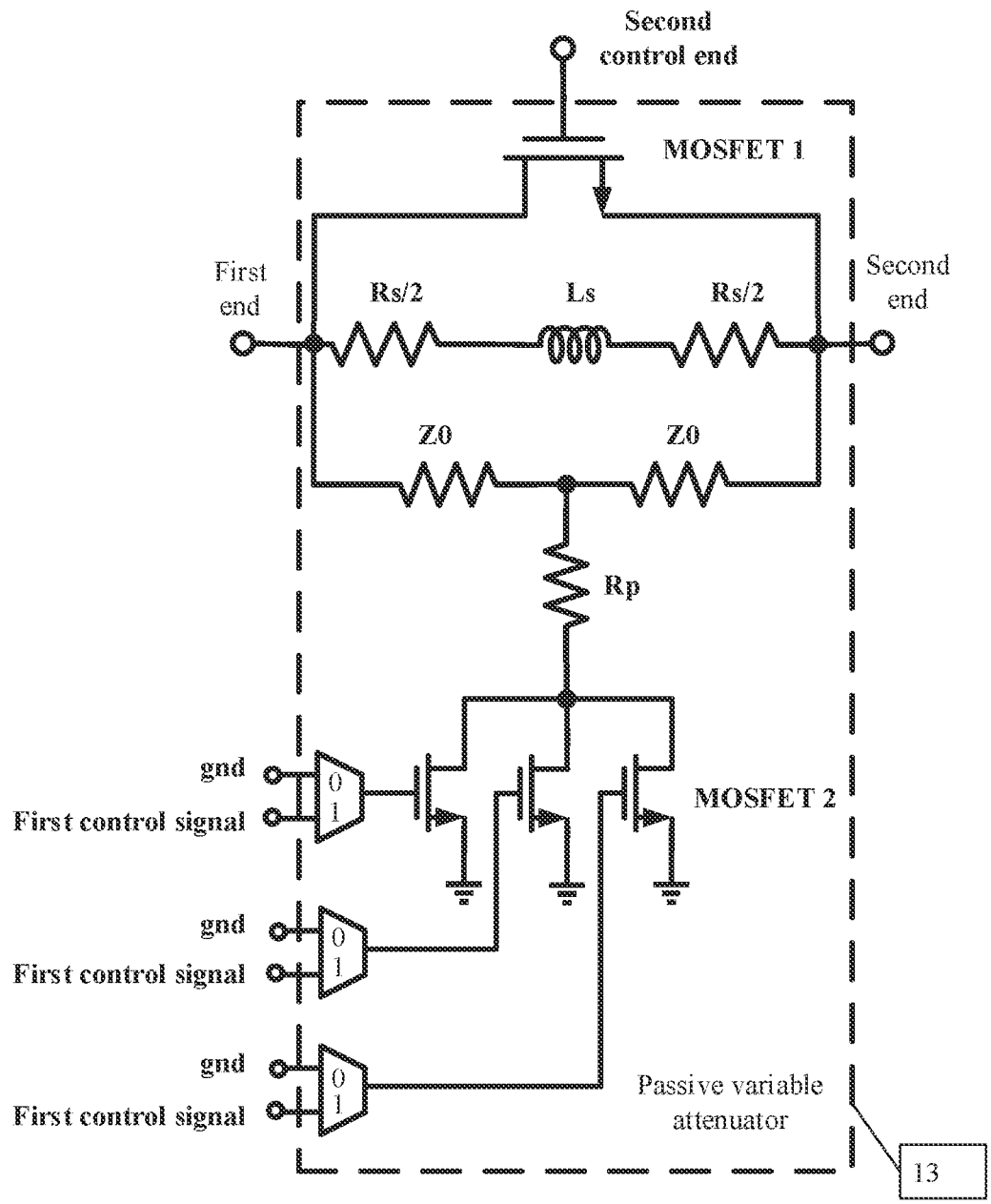
FIG. 17 is a schematic diagram of another embodiment of a passive variable attenuator in a temperature compensation circuit according to this application.

When a process change causes a change in a curve of changing with the temperature by a gain of the signal processing path, a temperature compensation curve of the temperature compensation circuit 1 needs to be correspondingly adjusted, to perform temperature compensation for the signal processing path, which may be completed by changing curves of changing with the temperature by the first control signal and the second control signal, or may be implemented by adjusting an attenuation capability of the passive variable attenuator 13. At a same temperature, a stronger attenuation capability indicates a larger value of attenuation generated by the passive variable attenuator 13 for a signal; otherwise, a value of attenuation generated for a signal is smaller. For example, in the embedded switch-mode passive variable attenuator 13, a variable resistor circuit of the series branch and/or a variable resistor circuit of the parallel branch may include at least two variable resistors connected in parallel. A control end of each variable resistor is controlled by a multiplexer, and through control of the multiplexer, the control signal output by the temperature conversion circuit 12 is input to the control end of the variable resistor, or a fixed level is input to the control end of the variable resistor. The attenuation capability of the passive variable attenuator 13 may be changed by using the multiplexer by changing a quantity of variable resistors connected to an output end of the temperature conversion circuit 12, to change the temperature compensation curve of the temperature compensation circuit 1. For example, based on the passive variable attenuator 13 shown in FIG. 12, the variable resistor circuit of the parallel branch includes three MOSFETs connected in parallel. Referring to FIG. 17, each MOSFET of the parallel branch is connected in series to Rp by using a source and a drain, a gate of the MOSFET serves as the first control end of the passive variable attenuator 13, and through control of a multiplexer, the first control signal output by the first temperature conversion circuit 121 is input to the first control end, or a fixed level (the fixed level may be a ground level gnd) is input to the first control end. When the attenuation capability of the passive variable attenuator 13 needs to be lowered, a quantity of MOSFETs connected to the first control signal output by the first temperature conversion circuit 121 may be reduced, and a MOSFET that is not connected to the first control signal output by the first temperature conversion circuit 121 is connected to the fixed level (usually the ground level). Otherwise, when the attenuation capability of the passive variable attenuator 13 needs to be enhanced, the quantity of MOSFETs connected to the first control signal output by the first temperature conversion circuit 121 may be increased, and a MOSFET that is not connected to the first control signal output by the first temperature conversion circuit 121 is still connected to the fixed level (usually the ground level). The process of adjusting the temperature compensation curve of the temperature compensation circuit 1 can be simplified by adjusting the attenuation capability of the passive variable attenuator 13 by using the multiplexer.

In the foregoing embodiments, because the signal processing path generally includes a plurality of components, temperatures of different components may be different. In an actual application, a temperature at a position of a component may be used to represent a temperature of the signal processing path. For example, it is assumed that a gain of a target component in the signal processing path is affected by a temperature more significantly than a gain of another component. Then, a temperature at a position of the target component may be used to represent the temperature of the signal processing path. Alternatively, temperatures at a plurality of positions in the signal processing path may be detected, and then an average value of the detected temperatures at the plurality of positions is used to represent the temperature of the signal processing path.

The foregoing describes, with reference to the accompanying drawings, specific implementations of the temperature compensation circuit that is provided in this application and applied to a signal processing path. The signal processing path may work in a microwave frequency band. Common signal processing paths that work in the microwave frequency band include a microwave mixer, a microwave low noise amplifier, a microwave switch, a phased array apparatus, various wideband circuits, and the like. With development of wireless communications technologies, wireless communications systems have higher requirements on antenna performance. Phased array apparatuses can implement electrical scanning of antenna beams in space, and therefore are more and more applied to wireless communications systems. The phased array apparatus is an array antenna chip that can adjust a phase and/or a gain of a signal in each phased array unit. Antenna beams can be automatically aligned and beams when an antenna shakes can be automatically tracked by adjusting a phase and/or again of a signal input to each phased array unit of the phased array apparatus. A temperature change may cause a signal gain change of the phased array apparatus, reduce accuracy of signal gain control of the phased array apparatus, and reduce accuracy of beam scanning and alignment of the phased array apparatus.

In a specific application, any possible implementation of the temperature compensation circuit 1 may be applied to the phased array apparatus, to reduce a signal gain change of the phased array apparatus caused by a temperature change, improve accuracy of signal gain control of the phased array apparatus, and improve accuracy of beam scanning and alignment of the phased array apparatus. In a possible implementation, referring to FIG. 18, a phased array apparatus provided in this application may include:

a plurality of antenna array units 2, a first temperature compensation circuit 1-1, and a common path 4. Each antenna array unit 2 has one end connected to an antenna, and the other end connected to one end of the common path 4, and each antenna array unit 2 is connected to the same end of the common path 4. Signals flowing through any antenna array unit 2 are all input to the common path 4, or output by the common path 4. The first temperature compensation circuit 1-1 is connected in series in the common path 4, and is configured to perform temperature compensation for the phased array apparatus based on a temperature of the antenna array unit 2, or perform temperature compensation for the phased array apparatus based on a temperature of the common path 4, or perform temperature compensation for the phased array apparatus based on temperatures of the antenna array unit 2 and the common path 4. Because signals flowing through any antenna array unit 2 are all input to the common path 4, or output by the common path 4, temperature compensation may be performed for the common path 4 and each antenna array unit 2 by using only the first temperature compensation circuit 1-1 connected in series in the common path 4, thereby helping reduce hardware overheads and reduce a size of the phased array apparatus.

Because temperatures in the antenna array units 2 and the combination path 4 may be different, in an actual application, the first temperature compensation circuit 1-1 may perform temperature compensation for the phased array apparatus based on a temperature of an antenna array unit 2 or an average temperature of all the antenna array units 2. Alternatively, the first temperature compensation circuit 1-1 may perform temperature compensation for the phased array apparatus based on the temperature of the common path 4, or the first temperature compensation circuit 1-1 may perform temperature compensation for the phased array apparatus based on an average temperature of the antenna array units 2 and the common path 4. In actual use, a temperature measurement position may be selected by considering how to maximize a temperature compensation effect on the phased array apparatus.

Figure 18:
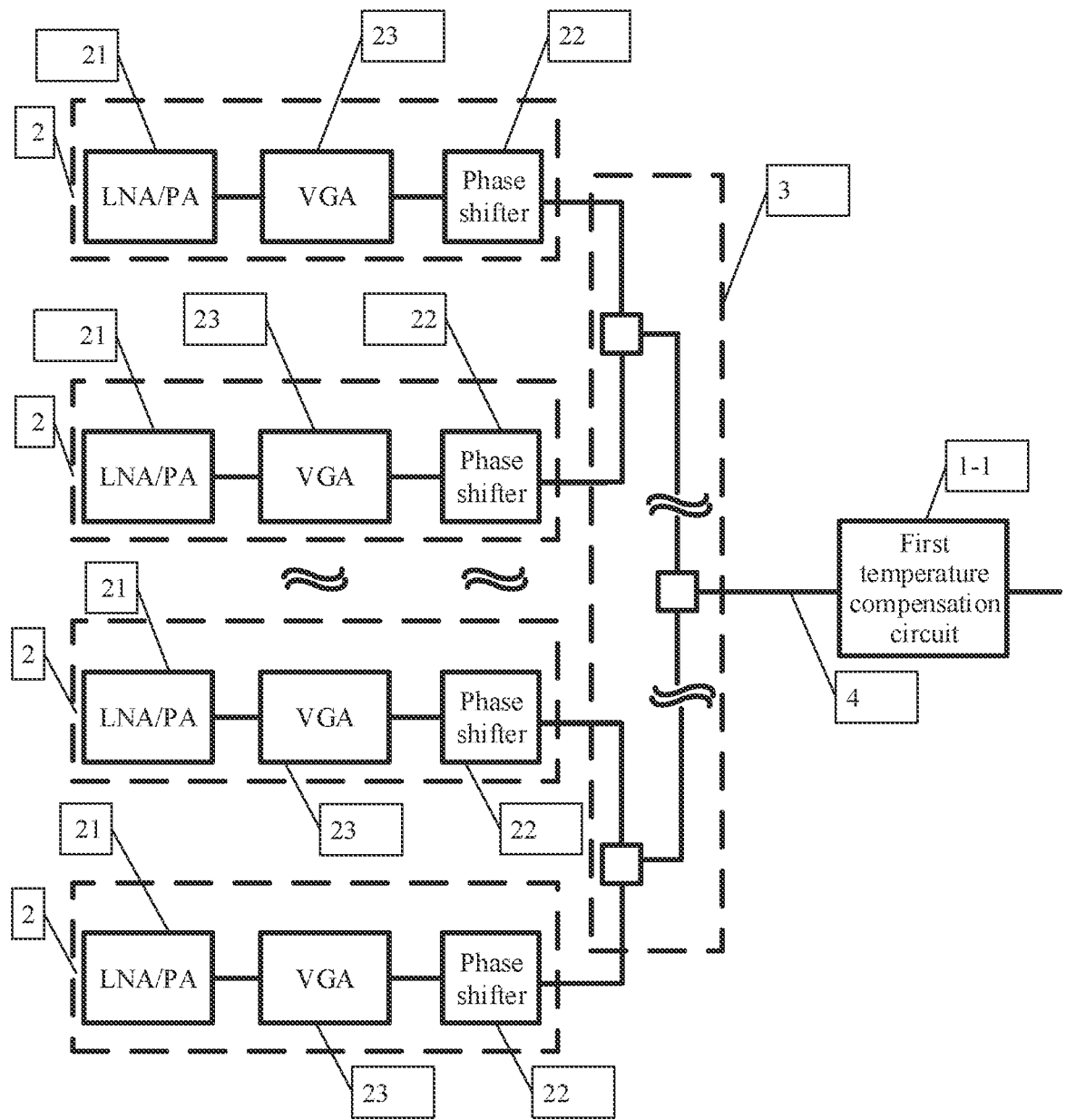
FIG. 18 is a schematic diagram of an embodiment of a phased array apparatus according to this application.

The phased array apparatus generally further includes a power division network and a power combiner network. The power division network is configured to implement signal distribution. The power combiner network combines signals in a same frequency band and different frequency bands. In a signal transmitting process, a dashed-line box 3 in FIG. 18 represents a power division network. In a signal receiving process, the dashed-line box 3 in FIG. 18 represents a power combiner network. The power division network/power combiner network 3 exchanges signals between each antenna array unit 2 and the common path 4.

Each antenna array unit 2 is connected to an antenna, and may transmit or receive a signal. When the antenna array unit 2 serves as a receive channel to receive a signal, the receive channel generally includes a low noise amplifier (LNA) 21, a variable gain amplifier (VGA) 23, and a phase shifter 22. Each antenna array unit 2 amplifies and phases a signal received on the antenna connected to the antenna array unit, and transmits an adjusted signal to the power combiner network 3. The power combiner network 3 combines received signals, and inputs a combined signal to the common path 4. When the antenna array unit 2 serves as a transmit channel to transmit a signal, the transmit channel generally includes a power amplifier (power amplifier, PA) 21, a VGA 23, and a phase shifter 22. The power division network 3 divides a signal in the common path 4, and outputs signals obtained after the division to different antenna array units 2. The antenna array units 2 phase and amplify the received signals, and transmit adjusted signals by using antennas connected to the antenna array units. In FIG. 18, for example, the antenna array unit 2 includes an LNA/PA 21, a VGA 23, and a phase shifter 22. In an actual application, the antenna array unit 2 may further include another component.

Figure 19:
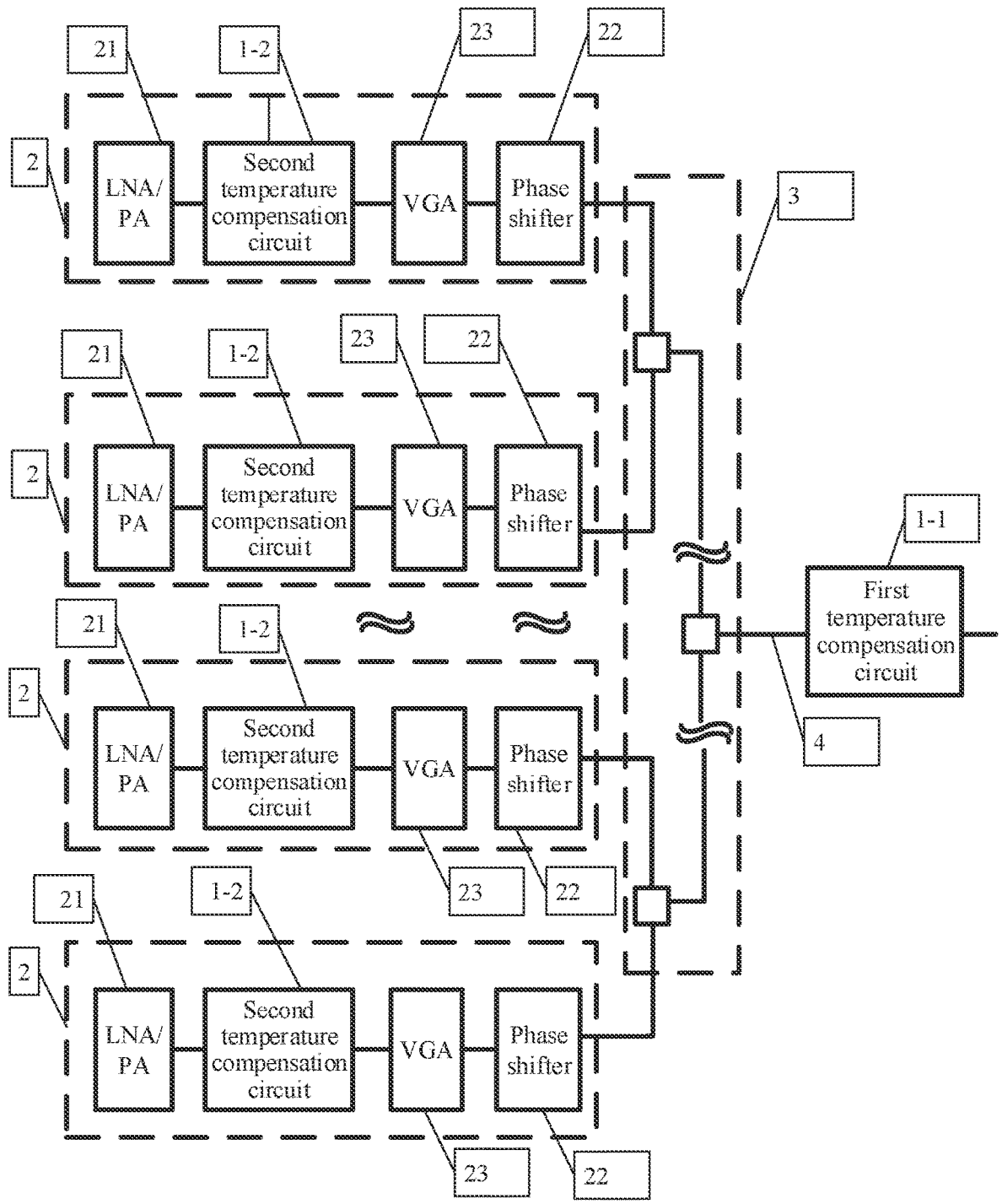
FIG. 19 is a schematic diagram of another embodiment of a phased array apparatus according to this application.

In a possible implementation, referring to FIG. 19, the phased array apparatus may further include a plurality of second temperature compensation circuits, each second temperature compensation circuit is connected in series in the antenna array unit 2, and the second temperature compensation circuit is disposed in a one-to-one correspondence with the antenna array unit 2. In other words, the second temperature compensation circuit is disposed in series in each antenna array unit 2. Each second temperature compensation circuit is configured to perform, based on a temperature of the antenna array unit 2 corresponding to the second temperature compensation circuit, temperature compensation for the antenna array unit 2 corresponding to the second temperature compensation circuit.

With the temperature compensation circuit placed in the common path 4, temperature compensation for the phased array apparatus may be implemented by using a relatively small quantity of components, which helps control a chip area. With the temperature compensation circuits placed in the antenna array units 2, gain consistency of the antenna array units 2 at different temperatures can be ensured. Because a gain of the temperature compensation circuit varies greatly with the temperature, a noise factor of the phased array apparatus is affected if the temperature compensation circuit is placed at an input end of the phased array apparatus, and linearity of the phased array apparatus is affected if the temperature compensation circuit is placed at an output end of the phased array apparatus. The temperature compensation circuits are respectively placed in the antenna array units 2 and the common path 4 of the antenna array units 2, so that the temperature compensation circuits are disposed in the phased array apparatus in a distributed manner, thereby helping minimize impact of the temperature compensation circuits on the linearity and noise of the phased array apparatus.

Optionally, the amplifier in the antenna array unit 2 may use a bias in direct proportion to an absolute temperature, to further enhance a temperature compensation capability for the phased array apparatus. The antenna array unit 2 generally includes a plurality of stages of amplifiers. Power consumption of an intermediate-stage amplifier (or referred to as an inter-stage amplifier) in the plurality of stages of amplifiers is generally relatively low. Power consumption and linearity are mainly determined by an output-stage amplifier such as a power amplifier. Therefore, optionally, the inter-stage amplifier (for example, the VGA 23 in FIG. 18) in the antenna array unit 2 uses a bias in direct proportion to an absolute temperature. In this way, impact on power consumption fluctuation and system linearity of the phased array apparatus can be minimized.

Figure 20:
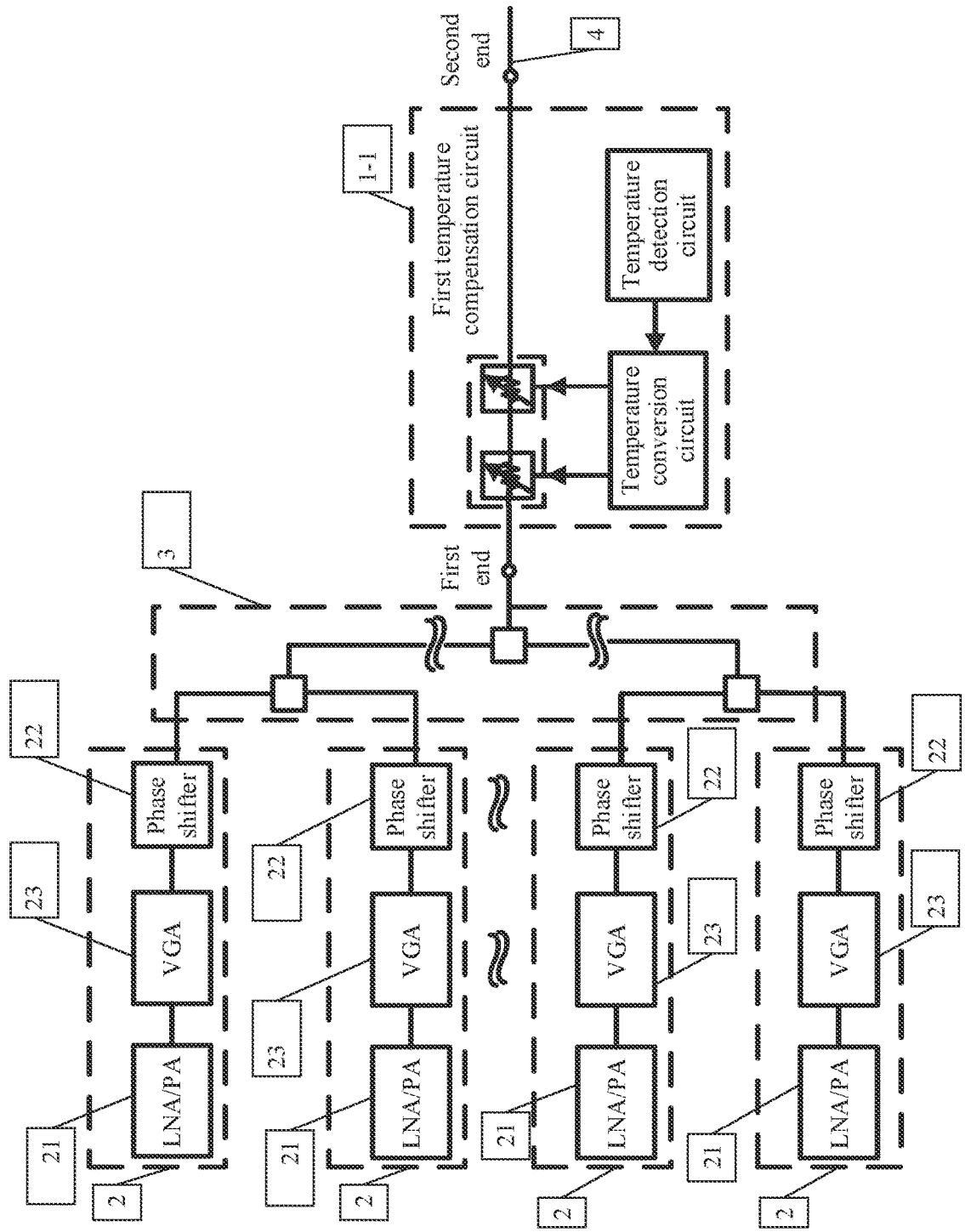
FIG. 20 is a schematic diagram of another embodiment of a phased array apparatus according to this application.

For specific descriptions of the first temperature compensation circuit 1-1 and the second temperature compensation circuits in the phased array apparatus in this application, refer to the foregoing descriptions of implementations of the temperature compensation circuit in this application. For example, it is assumed that the first temperature compensation circuit 1-1 in the phased array apparatus is the embodiment corresponding to FIG. 2. FIG. 20 is a schematic diagram of another embodiment of a phased array apparatus according to this application. In the phased array apparatus corresponding to FIG. 20, the temperature compensation circuit 1-1 is connected in series in the phased array apparatus by using the passive variable attenuator 13 inside the temperature compensation circuit. Specifically, the passive variable attenuator 13 is connected in series in the combination path 4 of the antenna array units 2 by using the first end and the second end of the passive variable attenuator. For the phased array apparatus corresponding to FIG. 20, refer to related descriptions of the embodiments corresponding to FIG. 18 and FIG. 2. Details are not described herein again.

The technical solutions provided in this application are described in detail above. The principle and implementation of this application are described herein by using specific examples. The description about the embodiments is merely provided to help understand the method and core ideas of this application. In addition, a person of ordinary skill in the art can make variations and modifications to this application in terms of the specific implementations and application scopes based on the ideas of this application. Therefore, the content of specification shall not be construed as a limit to this application.

What is claimed is:

1. A temperature compensation circuit, applied to a signal processing path, wherein the temperature compensation circuit comprises a temperature detection circuit, a temperature conversion circuit, and a passive variable attenuator, wherein the passive variable attenuator is configured to be connected in series in the signal processing path;
   the temperature detection circuit is configured to generate a temperature signal and a reference signal, and output the temperature signal and the reference signal to the temperature conversion circuit, wherein the temperature signal monotonically changes with a temperature of the signal processing path;
   the temperature conversion circuit is configured to generate a control signal based on the temperature signal and the reference signal; and
   the passive variable attenuator is configured to adjust, under control of the control signal, an attenuation value of a signal processed by the signal processing path.

2. The temperature compensation circuit according to claim 1, wherein the passive variable attenuator is a distributed attenuation structure, and the passive variable attenuator comprises a parallel branch and a series branch; and
   the temperature conversion circuit is configured to output the control signal to a control end of a variable resistor circuit of the parallel branch of the passive variable attenuator.

3. The temperature compensation circuit according to claim 2, wherein the variable resistor circuit comprises at least two variable resistors connected in parallel, a control end of the variable resistor is controlled by a multiplexer, and through control of the multiplexer, the control signal is input to the control end of the variable resistor, or a fixed level is input to the control end of the variable resistor.

4. The temperature compensation circuit according to claim 1, wherein the control signal is in a linear correlation with the temperature signal.

5. The temperature compensation circuit according to claim 4, wherein the temperature conversion circuit comprises a voltage follower, an operational amplifier, a first resistor, and a second resistor, wherein
   one end of the first resistor is connected to an output end of the voltage follower, the other end of the first resistor is connected to an out-phase input end of the operational amplifier, and two ends of the second resistor are respectively connected to the out-phase input end of the operational amplifier and an output end of the operational amplifier; and
   an input end of the voltage follower is configured to receive the temperature signal, an in-phase input end of the operational amplifier is configured to receive the reference signal, and the output end of the operational amplifier is configured to output the control signal.

6. The temperature compensation circuit according to claim 1, wherein the passive variable attenuator is an embedded switch-mode attenuator structure, and the passive variable attenuator comprises a series branch and a parallel branch;
   the control signal comprises a first control signal and a second control signal, and a trend of changing with the temperature by the second control signal is opposite to a trend of changing with the temperature by the first control signal; and
   the temperature conversion circuit is configured to output the first control signal to a control end of a variable resistor circuit of the parallel branch of the passive variable attenuator, and output the second control signal to a control end of a variable resistor circuit of the series branch of the passive variable attenuator.

7. The temperature compensation circuit according to claim 6, wherein the series branch of the passive variable attenuator comprises a phase compensation inductor, and the phase compensation inductor is configured to maintain a constant phase of the passive variable attenuator in cases of different attenuation values.

8. The temperature compensation circuit according to claim 7, wherein the temperature conversion circuit comprises a first temperature conversion circuit and a second temperature conversion circuit, and the first temperature conversion circuit is configured to generate the first control signal based on the temperature signal and the reference signal, wherein the first control signal is in a linear correlation with the temperature signal; and
   the second temperature conversion circuit is configured to generate the second control signal based on the temperature signal and the reference signal, wherein the second control signal is in a linear correlation with the temperature signal.

9. The temperature compensation circuit according to claim 8, wherein the first temperature conversion circuit comprises a first voltage follower, a first operational amplifier, a first resistor, and a second resistor, wherein
   one end of the first resistor is connected to an output end of the first voltage follower, the other end of the first resistor is connected to an out-phase input end of the first operational amplifier, and two ends of the second resistor are respectively connected to the out-phase input end and an output end of the first operational amplifier;
   an input end of the first voltage follower is configured to receive the temperature signal, an in-phase input end of the first operational amplifier is configured to receive the reference signal, and the output end of the first operational amplifier is configured to output the first control signal; and
   the second temperature conversion circuit comprises a second voltage follower, a second operational amplifier, a third resistor, and a fourth resistor, wherein
   one end of the third resistor is connected to an output end of the second voltage follower, the other end of the third resistor is connected to an out-phase input end of the second operational amplifier, and two ends of the fourth resistor are respectively connected to the out-phase input end and an output end of the second operational amplifier; and an input end of the second voltage follower is configured to receive the reference signal, an in-phase input end of the second operational amplifier is configured to receive the temperature signal, and the output end of the second operational amplifier is configured to output the second control signal.

10. The temperature compensation circuit according to claim 1, wherein the temperature detection circuit comprises a bandgap reference circuit, and the bandgap reference circuit is configured to generate the temperature signal and the reference signal.

11. The temperature compensation circuit according to claim 1, wherein the temperature detection circuit comprises a bandgap reference circuit and a temperature sensor circuit, the bandgap reference circuit is configured to generate the reference signal, and the temperature sensor circuit is configured to generate the temperature signal.

12. A phased array apparatus, comprising:
a plurality of antenna array units, a first temperature compensation circuit, and a common path, wherein
each antenna array unit has one end connected to an antenna, and the other end connected to a first end of the common path, and signals flowing through any antenna array unit are all input to the common path, or output by the common path; and
the first temperature compensation circuit is connected in series in the common path, and is configured to perform temperature compensation for the phased array apparatus based on a temperature of the antenna array unit and/or a temperature of the common path;
wherein the first temperature compensation circuit comprises a temperature detection circuit, a temperature conversion circuit, and a passive variable attenuator, wherein the passive variable attenuator in the first temperature compensation circuit is configured to be connected in series in the common path;
the temperature detection circuit in the first temperature compensation circuit is configured to generate a temperature signal and a reference signal, and output the generated temperature signal and reference signal to the temperature conversion circuit in the first temperature compensation circuit, wherein the temperature signal generated by the temperature detection circuit in the first temperature compensation circuit monotonically changes with a temperature of the antenna array unit and/or a temperature of the common path;
the temperature conversion circuit in the first temperature compensation circuit is configured to generate a control signal based on the temperature signal and the reference signal that are generated by the temperature detection circuit in the first temperature compensation circuit; and
the passive variable attenuator in the first temperature compensation circuit is configured to adjust, under control of the control signal generated by the temperature conversion circuit in the first temperature compensation circuit, an attenuation value of a signal processed by the phased array apparatus.

13. The phased array apparatus according to claim 12, wherein the phased array apparatus further comprises a plurality of second temperature compensation circuits, each of the second temperature compensation circuit is connected in series in the antenna array unit, the second temperature compensation circuit is disposed in a one-to-one correspondence with the antenna array unit, and each of the second temperature compensation circuit is configured to perform, based on a temperature of the antenna array unit corresponding to the second temperature compensation circuit, temperature compensation for the antenna array unit corresponding to the second temperature compensation circuit.

14. The phased array apparatus according to claim 13, wherein the second temperature compensation circuit comprises a temperature detection circuit, a temperature conversion circuit, and a passive variable attenuator, wherein the passive variable attenuator in the second temperature compensation circuit is configured to be connected in series in the corresponding antenna array unit;
the temperature detection circuit in the second temperature compensation circuit is configured to generate a temperature signal and a reference signal, and output the generated temperature signal and reference signal to the temperature conversion circuit in the second temperature compensation circuit, wherein the temperature signal generated by the temperature detection circuit in the second temperature compensation circuit monotonically changes with a temperature of the corresponding antenna array unit;
the temperature conversion circuit in the second temperature compensation circuit is configured to generate a control signal based on the temperature signal and the reference signal that are generated by the temperature detection circuit in the second temperature compensation circuit; and
the passive variable attenuator in the second temperature compensation circuit is configured to adjust, under control of the control signal generated by the temperature conversion circuit in the second temperature compensation circuit, an attenuation value of a signal processed by the antenna array unit corresponding to the second temperature compensation circuit.

15. The phased array apparatus according to claim 12, wherein the passive variable attenuator in the first temperature compensation circuit is a distributed attenuation structure, and the passive variable attenuator in the first temperature compensation circuit comprises a parallel branch and a series branch; and
the temperature conversion circuit in the first temperature compensation circuit is configured to output the control signal generated by the temperature conversion circuit in the first temperature compensation circuit to a control end of a variable resistor circuit of the parallel branch of the passive variable attenuator in the first temperature compensation circuit.

16. The phased array apparatus according to claim 12, wherein the control signal generated by the temperature conversion circuit in the first temperature compensation circuit is in a linear correlation with the temperature signal.

17. The phased array apparatus according to claim 16, wherein the temperature conversion circuit in the first temperature compensation circuit comprises a voltage follower, an operational amplifier, a first resistor, and a second resistor, wherein
one end of the first resistor is connected to an output end of the voltage follower, the other end of the first resistor is connected to an out-phase input end of the operational amplifier, and two ends of the second resistor are respectively connected to the out-phase input end of the operational amplifier and an output end of the operational amplifier; and an input end of the voltage follower is configured to receive the temperature signal generated by the temperature detection circuit in the first temperature compensation circuit, an in-phase input end of the operational amplifier is configured to receive the reference signal generated by the temperature detection circuit in the first temperature compensation circuit, and the output end of the operational amplifier is configured to output the control signal generated by the temperature conversion circuit in the first temperature compensation circuit.

18. The phased array apparatus according to claim 12, wherein the passive variable attenuator in the first temperature compensation circuit is an embedded switch-mode attenuator structure, and the passive variable attenuator in the first temperature compensation circuit comprises a series branch and a parallel branch;

the control signal generated by the temperature conversion circuit in the first temperature compensation circuit comprises a first control signal and a second control signal, and a trend of changing with the temperature by the second control signal is opposite to a trend of changing with the temperature by the first control signal; and the temperature conversion circuit in the first temperature compensation circuit is configured to output the first control signal to a control end of a variable resistor circuit of the parallel branch of the passive variable attenuator in the first temperature compensation circuit, and output the second control signal to a control end of a variable resistor circuit of the series branch of the passive variable attenuator in the first temperature compensation circuit.

19. The phased array apparatus according to claim 18, wherein the series branch of the passive variable attenuator in the first temperature compensation circuit comprises a phase compensation inductor, and the phase compensation inductor is configured to maintain a constant phase of the passive variable attenuator in the first temperature compensation circuit in cases of different attenuation values.

* * * * *